United States Patent
Sugai

(10) Patent No.: US 11,387,318 B2
(45) Date of Patent: Jul. 12, 2022

(54) SEMICONDUCTOR DEVICE AND METHOD OF MANUFACTURING A SEMICONDUCTOR DEVICE

(71) Applicant: FUJI ELECTRIC CO., LTD., Kawasaki (JP)

(72) Inventor: Isamu Sugai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 330 days.

(21) Appl. No.: 16/797,161

(22) Filed: Feb. 21, 2020

(65) Prior Publication Data

US 2020/0321433 A1 Oct. 8, 2020

(30) Foreign Application Priority Data

Apr. 4, 2019 (JP) .............................. JP2019-072028

(51) Int. Cl.
*H01L 29/78* (2006.01)
*H01L 29/06* (2006.01)
(Continued)

(52) U.S. Cl.
CPC ........ *H01L 29/0661* (2013.01); *H01L 21/761* (2013.01); *H01L 21/765* (2013.01);
(Continued)

(58) Field of Classification Search
CPC ............. H01L 29/7813; H01L 29/7397; H01L 29/407; H01L 29/7811; H01L 29/0634; H01L 29/4236; H01L 29/7802; H01L 29/0696; H01L 29/7806; H01L 29/0661; H01L 21/761; H01L 21/765; H01L 29/0623; H01L 29/0869; H01L 29/1095;
(Continued)

(56) References Cited

U.S. PATENT DOCUMENTS

2011/0108911 A1 5/2011 Matsuoka
2012/0199900 A1* 8/2012 Oosawa ............ H01L 29/66734
257/330

FOREIGN PATENT DOCUMENTS

| JP | 2003-101019 A | 4/2003 |
| JP | 2011-100877 A | 5/2011 |
| JP | 2012-164854 A | 8/2012 |

* cited by examiner

*Primary Examiner* — Selim U Ahmed
(74) *Attorney, Agent, or Firm* — Rabin & Berdo, P.C.

(57) ABSTRACT

A semiconductor device having an active region and a voltage withstand region comprises a first semiconductor layer of a first conductive type, a second semiconductor region of a second conductive type, disposed selectively on the front side of the first semiconductor layer, a plurality of first trench contact (TC) sections disposed at a peripheral section of the active region in the second semiconductor region, being apart from one another and extending in a first direction, a second trench contact (TC) disposed at the peripheral section of the active region in the second semiconductor region, extending in the first direction and being further from the voltage withstand region than the plurality of first trench contact sections, an electric conductor layer electrically connecting together the plurality of first TC sections, and a conductive connection region disposed between the first TC sections and second TC section, having a lower resistivity than the second semiconductor region, and electrically connecting the first TC sections and second TC section.

7 Claims, 20 Drawing Sheets

(51) Int. Cl.
    *H01L 29/08*      (2006.01)
    *H01L 29/10*      (2006.01)
    *H01L 29/40*      (2006.01)
    *H01L 29/66*      (2006.01)
    *H01L 21/761*    (2006.01)
    *H01L 21/765*    (2006.01)

(52) U.S. Cl.
    CPC ...... *H01L 29/0623* (2013.01); *H01L 29/0869* (2013.01); *H01L 29/1095* (2013.01); *H01L 29/402* (2013.01); *H01L 29/66727* (2013.01); *H01L 29/66734* (2013.01); *H01L 29/7811* (2013.01); *H01L 29/7813* (2013.01)

(58) Field of Classification Search
    CPC ............. H01L 29/402; H01L 29/66727; H01L 29/66734; H01L 29/0619; H01L 29/41766; H01L 29/78; H01L 29/0611; H01L 29/0684; H01L 29/66068; H01L 29/66477
    See application file for complete search history.

SEMICONDUCTOR DEVICE AND METHOD OF MANUFACTURING A SEMICONDUCTOR DEVICE

CROSS-REFERENCE TO RELATED APPLICATIONS

This application is based upon and claims the benefit of priority of the prior Japanese Patent Application No. 2019-072028, filed on Apr. 4, 2019, the entire contents of which are incorporated herein by reference.

TECHNICAL FIELD

The present invention relates to a semiconductor device and to method of manufacturing a semiconductor device.

BACKGROUND OF THE INVENTION

1. Field of the Invention

It has conventionally been a requirement for semiconductor devices with pn junctions to have non-damage tolerance against inductive load or recovery current produced during ON/OFF operation (voltage endurance and current endurance).

2. Description of the Related Art

It has been proposed, for example, to place trench contact sections in the p-type regions forming pn junctions, to allow the carrier accumulated in the depletion layer to move to the electrodes via the trench contact sections (Japanese Unexamined Patent Publication No. 2011-100877 and Japanese Unexamined Patent Publication No. 2012-164854, for example).

FIG. 1 is a plan view showing an example of a conventional semiconductor device, FIG. 2 is an enlarged plan view of the rectangular region shown by the dot and dash line in FIG. 1, FIG. 3 is a cross-sectional view along line A1-A1' of FIG. 2, and FIG. 4 is a partial plan view along line C1-C1' of FIG. 3, including the rectangular region shown by the dot and dash line in FIG. 2.

As shown in FIG. 1, the semiconductor device 100 has a rectangular shape overall in the plan view. As shown in FIG. 2, the semiconductor device 100 has an active region 110a in which the main structure of the semiconductor element is disposed, and a voltage withstand region 110b that moderates the electric field generated in the active region 110a. The active region 110a has an overall rectangular shape in the plan view, and is disposed on the inner side of the semiconductor device 100. The voltage withstand region 110b is disposed on the outer side of the active region 110a, surrounding the active region 110a. An active terminal section 110c is disposed at the end on the voltage withstand region 110b side of the active region 110a.

As shown in FIG. 3, the semiconductor device 100 has an n$^+$-type silicon substrate 111 and an n$^-$-type drift layer 112 disposed on the n$^+$-type silicon substrate 111. On the front side of the n$^-$-type drift layer 112, a first p-type region 113, a second p-type region 114, a p-type base region 118 and a third p-type region 127 are selectively disposed.

The p-type base region 118 is disposed in a manner extending in the direction along the border between the voltage withstand region 110b and the active terminal section 110c (the y-axis direction: see FIG. 2). An n-type source region 119 is disposed on the front side of the p-type base region 118. The n-type source region 119 is disposed in a manner extending in the y-axis direction (see FIG. 2), together with the p-type base region 118.

The third p-type region 127 is disposed along the outer periphery of the voltage withstand region 110b. The semiconductor device 100 also has an interlayer dielectric film 122 disposed on the n$^-$-type drift layer 112.

On the n$^-$-type drift layer 112 between the first p-type region 113 and the p-type base region 118, a gate oxide film 120 and a gate electrode 121 are disposed straddling from the first p-type region 113 to the n-type source region 119. The interlayer dielectric film 122 is disposed on the gate electrode 121.

In the active region 110a, a source electrode 123 is disposed on the interlayer dielectric film 122. In the voltage withstand region 110b, a gate runner 125 and field plate 126, which are electric conductors, are disposed on the interlayer dielectric film 122 with a spacing between them. A drain electrode 124 is disposed under the n$^+$-type silicon substrate 111. The gate runner 125 is electrically connected to a gate electrode pad 128 that is disposed on the interlayer dielectric film 122. The gate electrode pad 128 is an electric conductor.

As shown in FIG. 3, a first trench contact section 115a, a second trench contact section 115b and a third trench contact section 115c are disposed in the first p-type region 113 of the active terminal section 110c. The electric conductors are disposed in a manner embedded inside the first trench contact section 115a, the second trench contact section 115b and the third trench contact section 115c.

In the first trench contact section 115a, the second trench contact section 115b and the third trench contact section 115c, trenches (grooves) are disposed in order in the direction from the voltage withstand region 110b side toward the active region 110a side (the positive direction on the x-axis), with spacings between them. Electric conductors are embedded in each of the trenches (grooves). Of the three trench contact sections, the first trench contact section 115a is disposed furthest to the voltage withstand region 110b side (the negative direction on the x-axis).

As shown in FIG. 2, the first trench contact section 115a, second trench contact section 115b and third trench contact section 115c are disposed extending continuously in the y-axis direction.

Also, the electric conductors embedded in the first trench contact section 115a, second trench contact section 115b and third trench contact section 115c are formed integrally with the source electrode 123, and are electrically connected to the source electrode 123.

As shown in FIG. 3, a first p$^+$-type region 117a is disposed at the end of the first trench contact section 115a (the end on the opposite side from the source electrode 123). Similarly, a second p$^+$-type region 117b is disposed at the end of the second trench contact section 115b, and a third p$^+$-type region 117c is disposed at the end of the third trench contact section 115c.

The semiconductor device 100 also has a fourth trench contact section 115d. A fourth p$^+$-type region 117d is disposed at the end of the fourth trench contact section 115d. The semiconductor device 100 still further has a fifth trench contact section 115e. A fifth p$^+$-type region 117e is disposed at the end of the fifth trench contact section 115e. The end of the first trench contact section 115a, the end of the second trench contact section 115b, the end of the third trench contact section 115c, the end of the fourth trench contact section 115d and the end of the fifth trench contact section 115e represent the bottoms of the trenches (grooves) of the respective trench contact sections.

When the semiconductor device 100 is OFF, a depletion layer is formed at the pn junction between the n⁻-type drift layer 112 and the p-type regions including the first p-type region 113, second p-type region 114, p-type base region 118 and third p-type region 127.

The carrier accumulated in the depletion layer is able to move to the source electrode 123 or field plate 126, via the first p⁺-type region 117a to fifth p⁺-type region 117e and the first trench contact section 115a to fifth trench contact section 115e. This inhibits parasitic bipolar operation when the semiconductor device 100 is OFF, thus increasing the tolerance to avalanche breakdown.

The carrier produced by inductive load or recovery current is concentrated at the active terminal section 110c, which is the end of the active region 110a on the voltage withstand region 110b side.

The first trench contact section 115a to third trench contact section 115c are disposed on the active terminal section 110c of the semiconductor device 100, allowing conduction of a large current to the source electrode 123.

When the semiconductor device 100 is ON, as the width of the depletion layer that was being formed during OFF decreases, the carrier that was accumulating in the depletion layer on the front side of the active terminal section 110c is drawn into the source electrode 123 via the electric conductors embedded in the first trench contact section 115a to third trench contact section 115c, as shown in FIG. 4. Similarly, the carrier that was accumulating in the depletion layer on the back side is drawn into the drain electrode 124.

The carrier flows into and is concentrated in the first trench contact section 115a located furthest to the voltage withstand region 110b side. At the active terminal section 110c, the first trench contact section 115a extends continuously in the y-axis direction and extends from the source electrode 123 side toward the drain electrode 124 side. Therefore, the first trench contact section 115a impedes the carrier from flowing from the voltage withstand region 110b side toward the active region 110a side, overflowing the first trench contact section 115a and migrating toward the second trench contact section 115b and third trench contact section 115c.

When the width of the depletion layer decreases, therefore, most of the carrier that had been accumulating in the depletion layer on the front side of the active terminal section 110c is drawn into the source electrode 123 via the first trench contact section 115a. Large flow of current to the first trench contact section 115a thus causes heat release, potentially resulting in damage of the semiconductor device 100. As a result, the tolerance of the semiconductor device 100 to inductive load and recovery current has potentially been inadequate.

SUMMARY

According to a first mode of the invention disclosed herein there is provided. The semiconductor device has an active region and a voltage withstand region surrounding the active region, and the semiconductor device includes a first semiconductor layer of a first conductive type extending from the active region to the voltage withstand region, a second semiconductor region of a second conductive type, selectively disposed in the first semiconductor layer at a front side thereof; a plurality of first trench contact sections disposed at a peripheral section of the active region in the second semiconductor region, the plurality of first trench contact sections being apart from one another, and extending in a first direction, a second trench contact section disposed at the peripheral section of the active region in the second semiconductor region, the second trench contact section extending in the first direction, and being further from the voltage withstand region than the plurality of first trench contact sections in a second direction orthogonal to the first direction, an electric conductor layer that electrically connects together the plurality of first trench contact sections, and a first conductive connection region of the second conductive type, disposed in the second semiconductor region between the second trench contact section and the plurality of first trench contact sections, the first conductive connection region having a resistivity lower than a resistivity of the second semiconductor region, and electrically connecting the plurality of first trench contact sections to the second trench contact section.

In this semiconductor device, the first conductive connection region may be disposed between the second trench contact section and the plurality of first trench contact sections, and between the second trench contact section and intervals between each adjacent two of the first trench contact sections.

This semiconductor device may have a third trench contact section disposed in the second semiconductor region at the peripheral section of the active region, the third trench contact section being further from the voltage withstand region than the second trench contact section, the third trench contact section extending in the first direction, and being disposed apart from the second trench contact section. The second trench contact section may be formed by a plurality of conductor parts which extend in the first direction, and are apart from one another.

In addition, the semiconductor device may have a second conductive connection region of the second conductive type, having a resistivity lower than the resistivity of the second semiconductor region, electrically connecting the second trench contact section and the third trench contact section, and being disposed in the second semiconductor region between the second trench contact section and the third trench contact section.

Furthermore, in this semiconductor device, a ratio of a total length of the plurality of first trench contact sections in the first direction, to a sum of the total length of the plurality of first trench contact sections and a total length of intervals between each adjacent two of the plurality of first trench contact sections in the first direction, may be in a range of 50% to 99%.

The semiconductor device further may have a third semiconductor region of the second conductive type, disposed at bottoms of the second trench contact section and one of the plurality of first trench contact sections, the third semiconductor region having a resistivity lower than the resistivity of the second semiconductor region.

In particular, the semiconductor device may have a fourth semiconductor region of the second conductive type having a resistivity lower than the resistivity of the second semiconductor region, at a bottom of the third trench contact section.

According to a second mode of the invention disclosed herein there is provided a semiconductor device manufacturing method. The method of a semiconductor device that has an active region and a voltage withstand region surrounding the active region, includes providing a semiconductor substrate, disposing a first semiconductor layer of a first conductive type on the semiconductor substrate, and a second semiconductor region of a second conductive type selectively in the first semiconductor layer, forming, at a peripheral section of the active region in the second semiconductor region, a plurality of first trenches that are aligned in a first direction, and a second trench extending in the first direction, the second trench being further from the voltage withstand region than the first trenches, and being apart from the plurality of first trenches in a second direction orthogonal to the first direction, forming a conductive connection region at a front side of the second semiconductor region in an area between the second trench and the plurality of first trenches, the conductive connection region spanning across from the plurality of first trenches to the second trench, the conductive connection region having a resistivity lower than a resistivity of the second semiconductor region, filling electric conductors into the plurality of first trenches and the second trench, and forming an electric conductor layer that electrically connects together the electric conductors filled into the plurality of the first trenches.

Objects, features and advantages of the present invention are specifically set forth in or will become apparent from the following detailed description of the invention when read in conjunction with the accompanying drawings.

DESCRIPTION OF EMBODIMENTS

A first embodiment of the semiconductor device disclosed herein will now be described with reference to the accompanying drawings. However, the technical scope of the invention is not limited to this embodiment, and includes the invention and its equivalents as laid out in the Claims.

Throughout the present specification, the layers or regions denoted by "n" indicate electrons as the majority carrier, and the layers or regions denoted by "p" indicate positive holes as the majority carrier. The symbol "+" attached to "n" or "p" indicates a higher impurity concentration compared to layers or regions without the symbol, and the symbol "−" attached to "n" or "p" indicates lower impurity concentration compared to layers or regions without the symbol.

Figure 1:
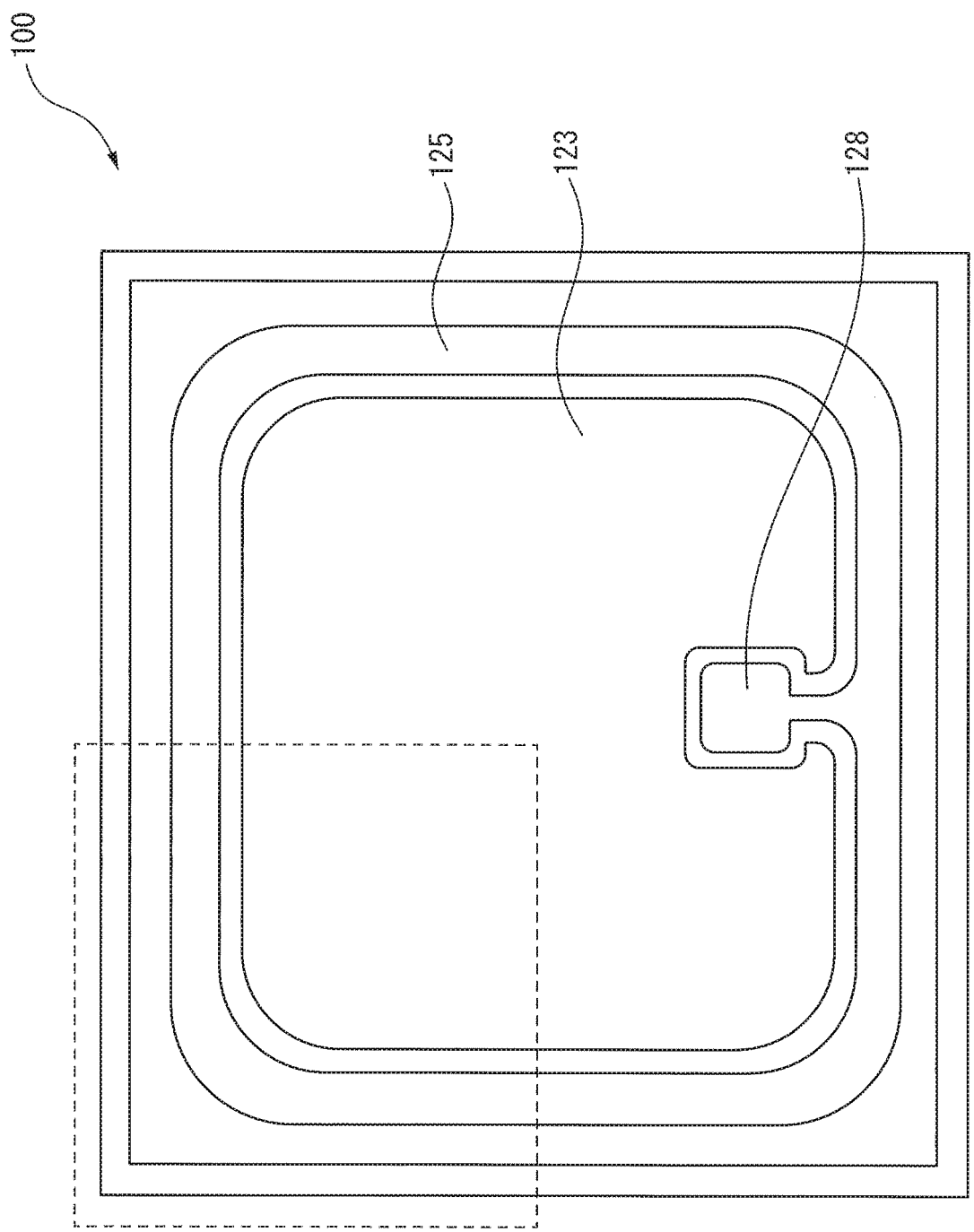
FIG. 1 is a plan view of a semiconductor device according to a related art example.
Figure 2:
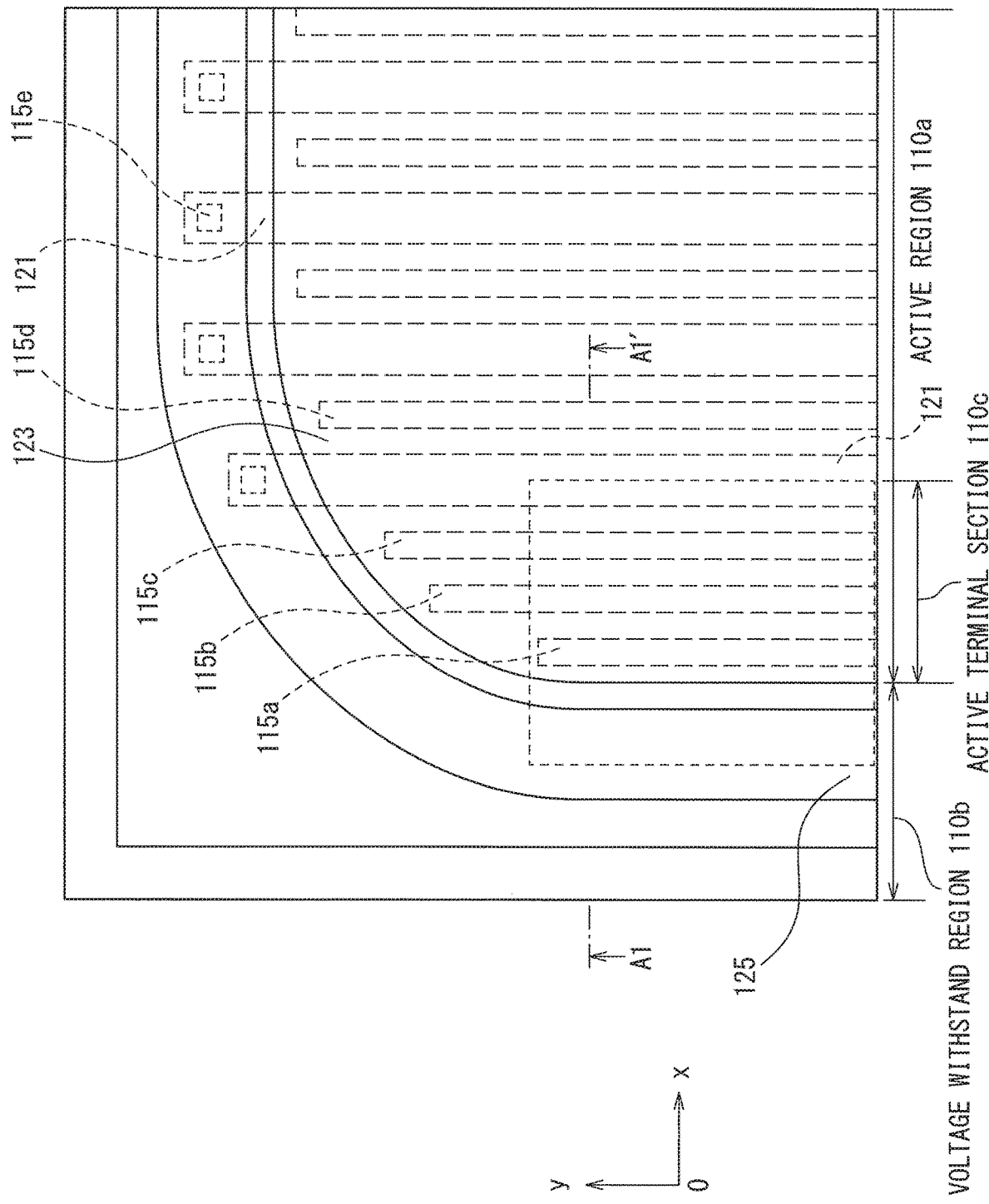
FIG. 2 is an enlarged plan view of the rectangular region indicated by the dot and dash line in FIG. 1.
Figure 3:
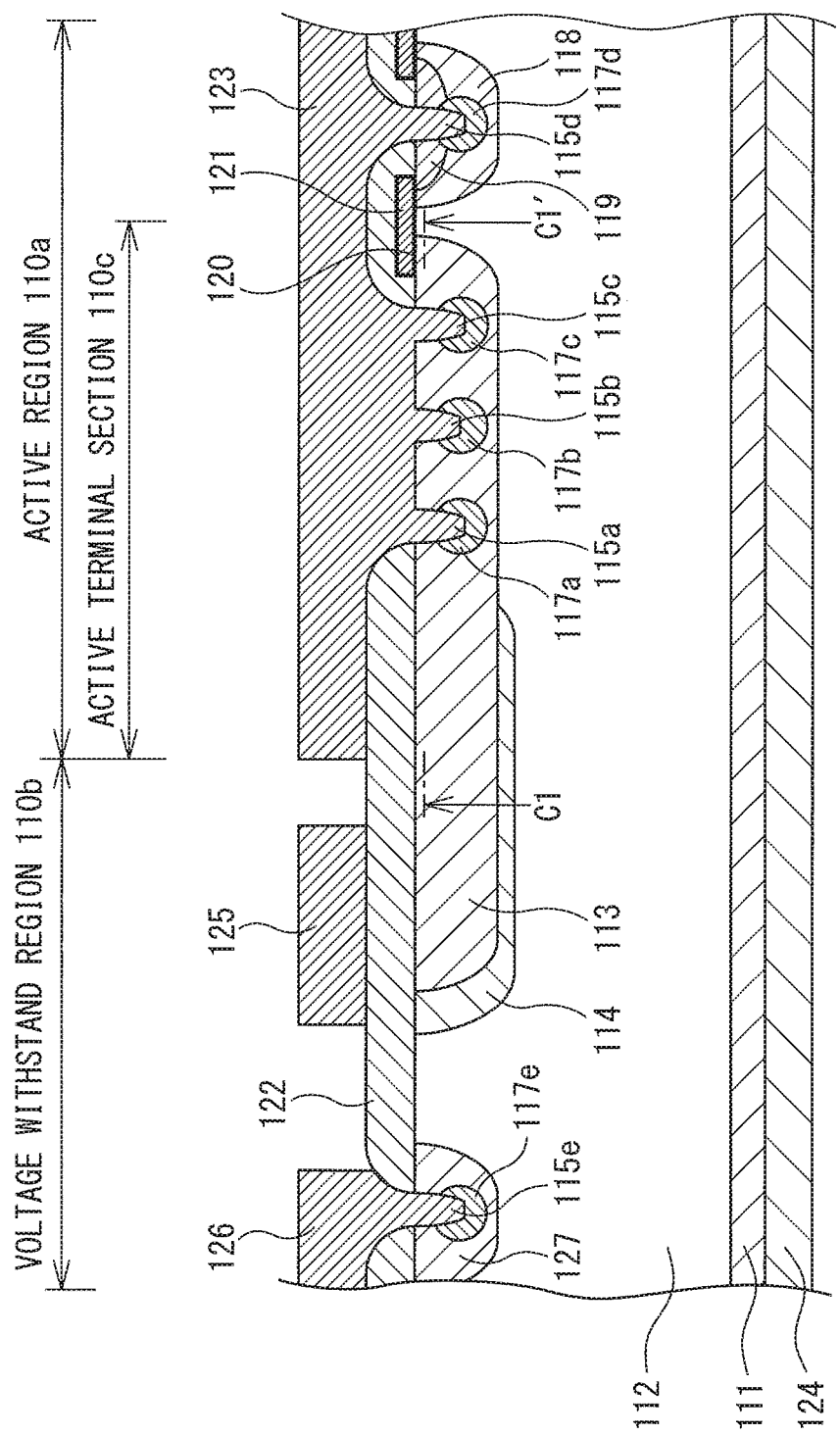
FIG. 3 is a cross-sectional view along line A1-A1' of FIG. 2.
Figure 4:
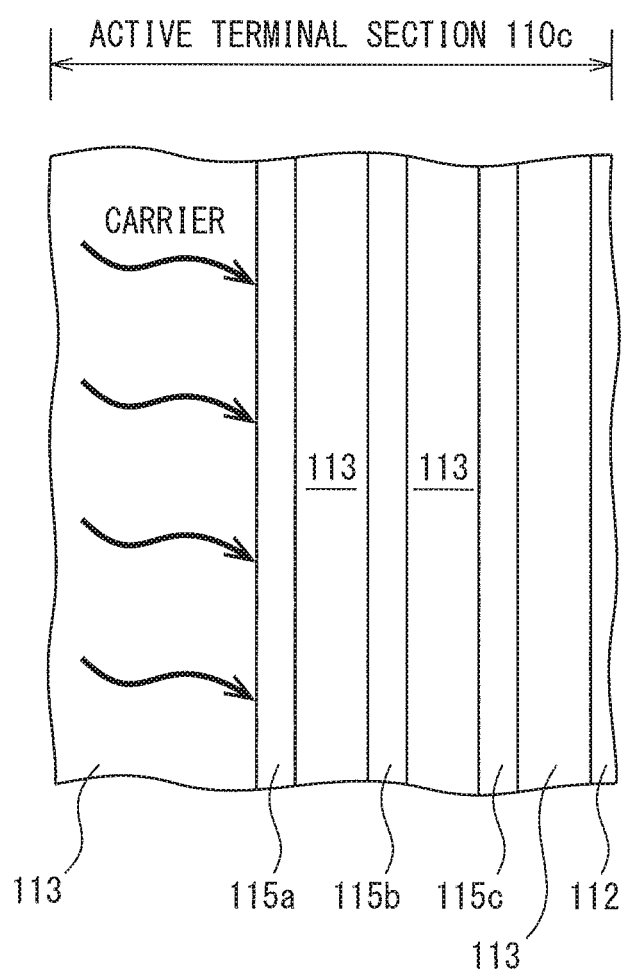
FIG. 4 is a partial plan view along line C1-C1' of FIG. 3, including the rectangular region indicated by the dot and dash line in FIG. 2.
Figure 5:
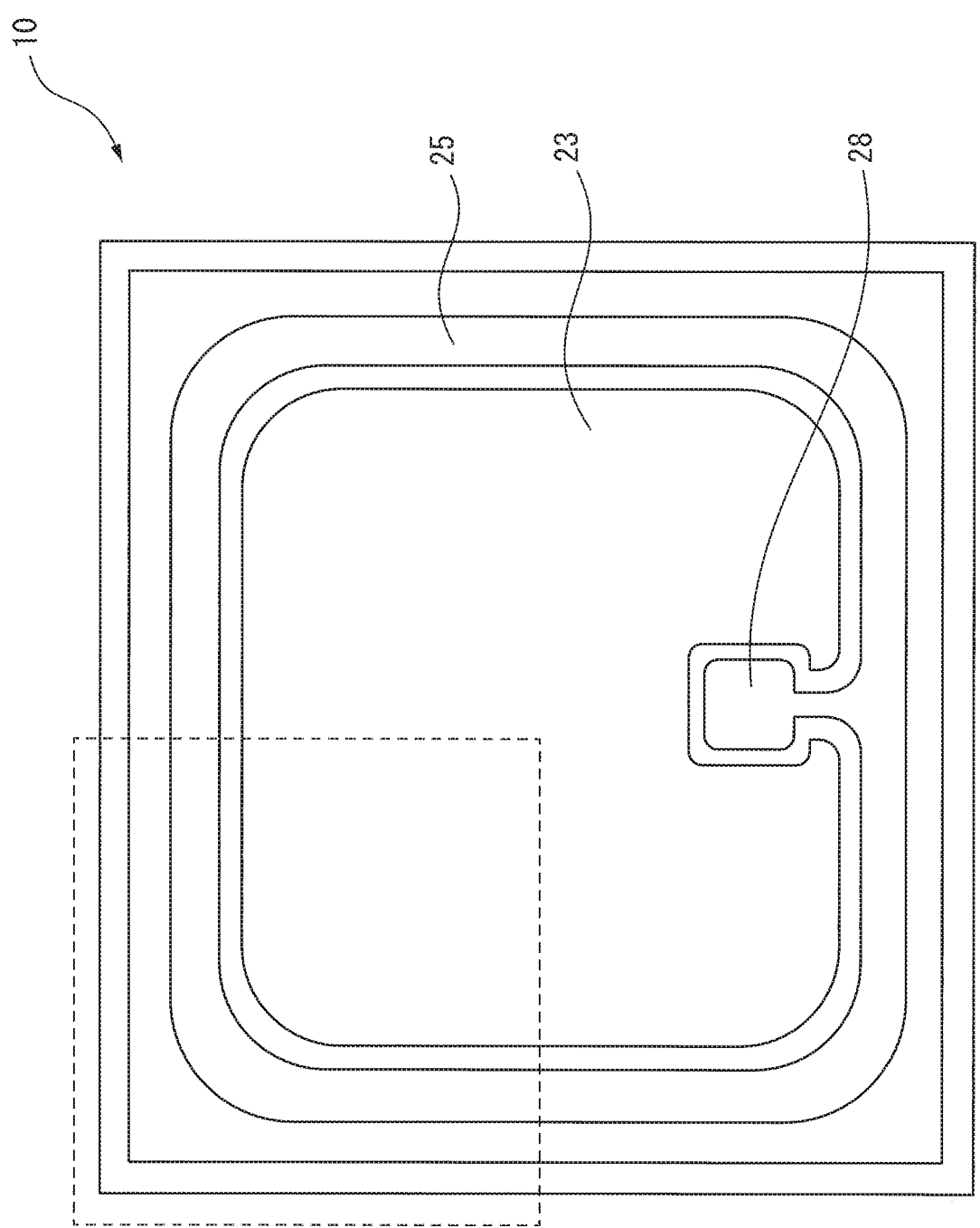
FIG. 5 is a plan view showing a first embodiment of the semiconductor device disclosed herein.
Figure 6:
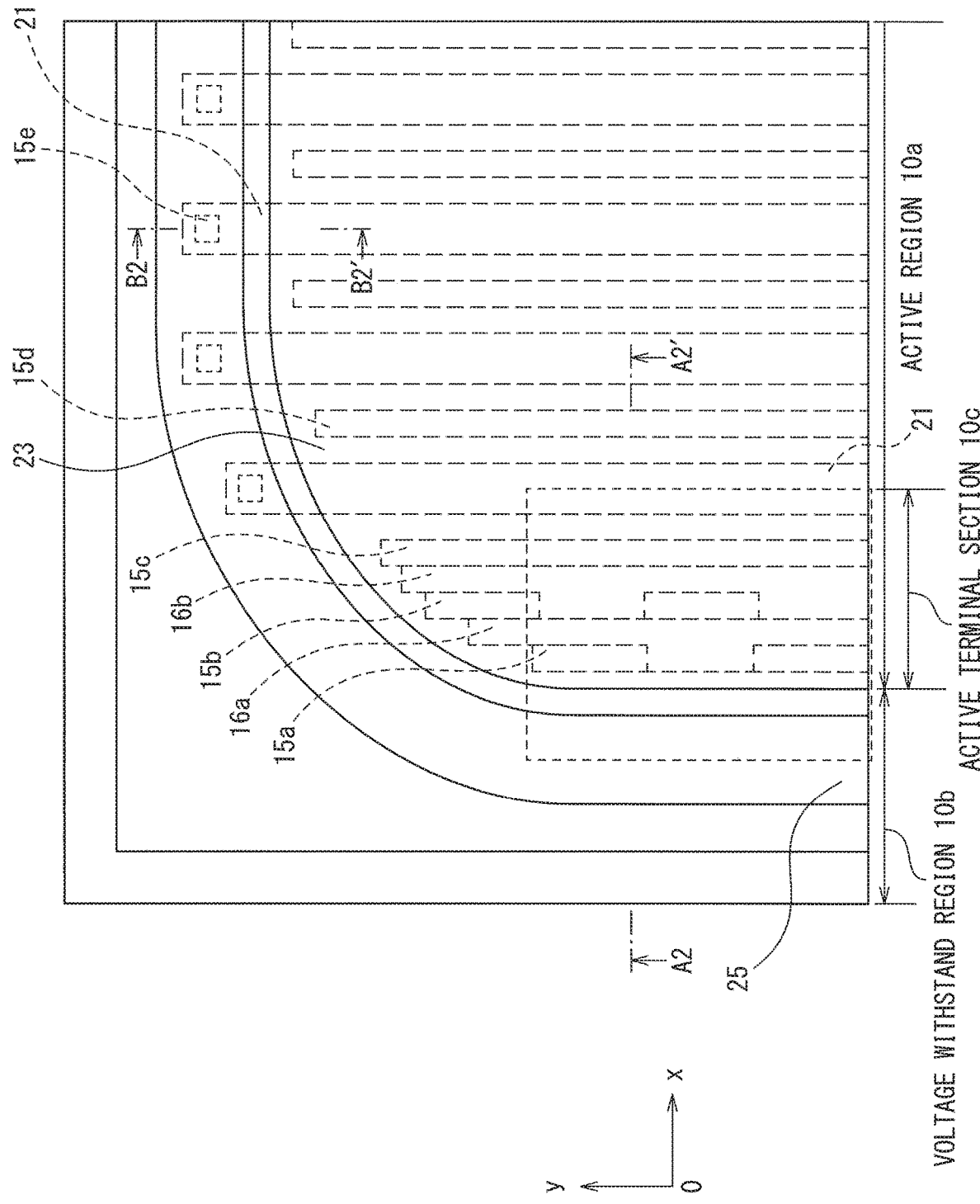
FIG. 6 is an enlarged plan view of the rectangular region indicated by the dot and dash line in FIG. 5.
Figure 7:
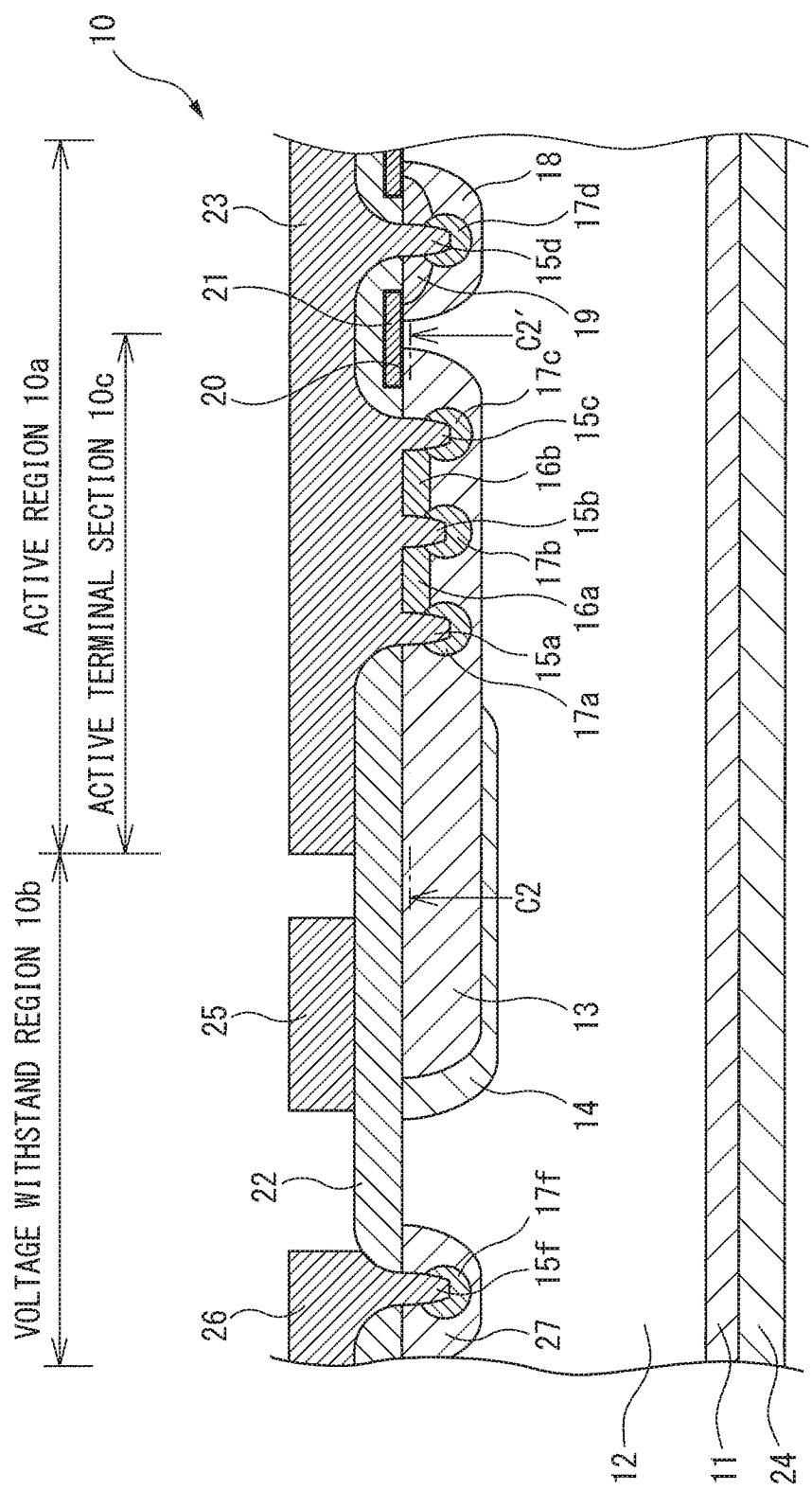
FIG. 7 is a cross-sectional view along line A2-A2' of FIG. 6.
Figure 8:
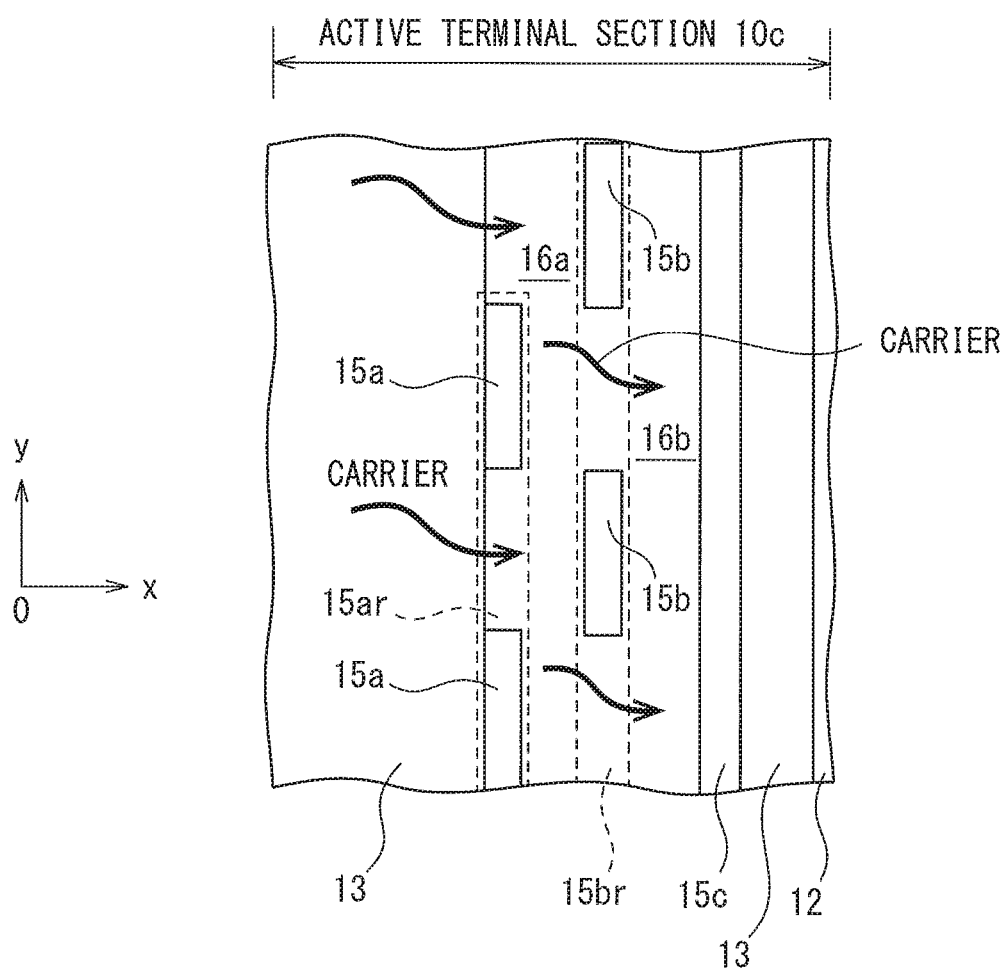
FIG. 8 is a partial plan view along line C2-C2' of FIG. 7, including the rectangular region indicated by the dot and dash line in FIG. 6.
Figure 9:
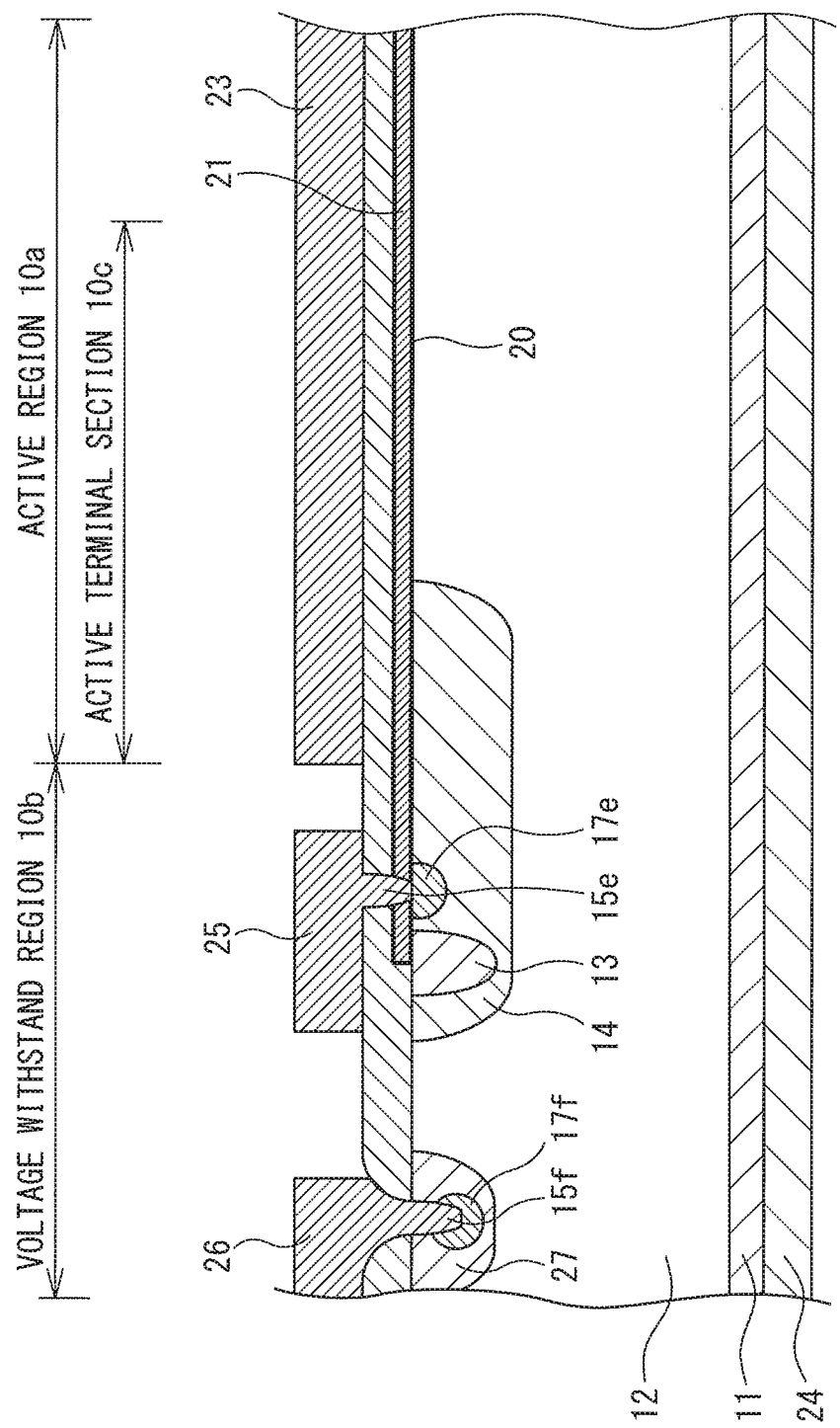
FIG. 9 is a cross-sectional view along line B2-B2' of FIG. 6.

FIG. 5 is a plan view showing a first embodiment of the semiconductor device disclosed herein. FIG. 6 is an enlarged plan view of the rectangular region indicated by the dot and dash line in FIG. 5. FIG. 7 is a cross-sectional view along line A2-A2' of FIG. 6. FIG. 8 is a partial plan view along line C2-C2' of FIG. 7, including the rectangular region indicated by the dot and dash line in FIG. 6. FIG. 9 is a partial plan view along line B2-B2' of FIG. 6.

As shown in FIG. 5, the semiconductor device 10 has a rectangular shape overall in the plan view. As shown in FIG. 6, the semiconductor device 10 has an active region 10a in which the main structure of the semiconductor element such as a MOSFET (Metal Oxide Semiconductor Field Effect Transistor) is disposed, and a voltage withstand region 10b that moderates the electric field generated in the active region 10a. The active region 10a has an overall rectangular shape in the plan view, and is disposed on the inner side of the semiconductor device 10. The voltage withstand region 10b is disposed on the outer side of the active region 10a, surrounding the active region 10a. An active terminal section 10c is disposed at the end on the voltage withstand region 10b side of the active region 10a.

As shown in FIG. 7, the semiconductor device 10 has an n$^+$-type silicon substrate 11 of the first conductive type and an n$^-$-type drift layer 12 of the first conductive type, disposed on the n$^+$-type silicon substrate 11.

The n$^+$-type silicon substrate 11 may be a single crystal silicon substrate with addition of an impurity that imparts polarity of the first conductive type, such as arsenic or antimony. The n$^-$-type drift layer 12 may be e formed by layering a silicon epitaxial layer with addition of arsenic or antimony at a lower impurity concentration than the n$^+$-type silicon substrate 11, onto the silicon substrate.

On the front side of the n$^-$-type drift layer 12, there are selectively disposed a first p-type region 13 of the second conductive type, a second p-type region 14 of the second conductive type, a p-type base region 18 of the second conductive type and a third p-type region 27 of the second conductive type.

Throughout the present specification, the front side of the semiconductor device 10 means the side on which the source electrode 23 (described below) is disposed, and the back side of the semiconductor device 10 means the side on which the drain electrode 24 (described below) is disposed.

The first p-type region 13, second p-type region 14, p-type base region 18 and third p-type region 27 may be formed with addition of an impurity that imparts polarity of the second conductive type, such as boron or aluminum, to the silicon epitaxial layer. Addition to the epitaxial layer refers to doping, and for example, an impurity may be injected by ion implantation and activated by heat treatment or the like. In the semiconductor device 10, the impurity concentrations in the first p-type region 13, second p-type region 14, p-type base region 18 and third p-type region 27 may be approximately the same.

The first p-type region 13 and second p-type region 14 are disposed along the outer periphery of the active region 10a, straddling from the voltage withstand region 10b side to the active terminal section 10c side. The first p-type region 13 and second p-type region 14 are partially overlapping.

The p-type base region 18 is disposed in a manner extending in the y-axis direction, in the plan view (see FIG. 6). The third p-type region 27 is disposed along the outer periphery of the voltage withstand region 10b, in the plan view.

An n-type source region 19 of the first conductive type is disposed on the front side of the p-type base region 18. The n-type source region 19 is disposed in a manner extending in the y-axis direction in the plan view (see FIG. 6), together with the p-type base region 18.

The n-type source region 19 may be formed with addition of phosphorus or arsenic to the silicon epitaxial layer, at a lower impurity concentration than the $n^+$-type silicon substrate 11.

The semiconductor device 10 also has an interlayer dielectric film 22 disposed on the $n^-$-type drift layer 12. For the interlayer dielectric film 22 there may be used silicon oxide, PSG (phosphorus-added silicon oxide) or BPSG (phosphorus- and boron-added silicon oxide), for example.

On the $n^-$-type drift layer 12 between the first p-type region 13 and the p-type base region 18, a gate oxide film 20 and a gate electrode 21 are disposed straddling from the first p-type region 13 to the n-type source region 19. The interlayer dielectric film 22 that has an electrical insulating property is disposed on the gate electrode 21. The gate oxide film 20 and gate electrode 21 are disposed in a manner extending in the y-axis direction in the plan view (see FIG. 6), together with the p-type base region 18 and n-type source region 19. Silicon oxide or silicon nitride, for example, may be used as the gate oxide film 20.

In the active region 10a, a source electrode 23 is disposed on the interlayer dielectric film 22. Aluminum or an alloy composed mainly of aluminum, for example, may be used as the source electrode 23.

In the voltage withstand region 10b, a gate runner 25 and field plate 26 are disposed on the interlayer dielectric film 22 with a spacing between them. Aluminum or an alloy composed mainly of aluminum, for example, may be used as electric conductors for the gate runner 25 and field plate 26.

As shown in FIG. 5, the field plate 26 is disposed along the rectangular outline of the semiconductor device 10, in the plan view.

The gate runner 25 is disposed between the field plate 26 and the source electrode 23, across spacings from the field plate 26 and source electrode 23, respectively. The interlayer dielectric film 22 is exposed between the gate runner 25 and field plate 26 and between the gate runner 25 and source electrode 23. The gate runner 25 is electrically connected to a gate electrode pad 28 that is disposed on the interlayer dielectric film 22. The gate runner 25 also surrounds the source electrode 23 of the active region 10a, in the plan view. The source electrode 23 is disposed on the inner side of the gate runner 25. Aluminum or an alloy composed mainly of aluminum, for example, may be used as the gate electrode pad 28.

The semiconductor device 10 further has a drain electrode 24 under the $n^+$-type silicon substrate 11. As the drain electrode 24 there may be used, for example, a conductive film of titanium, aluminum, an alloy composed mainly of aluminum, nickel, gold, silver or the like, or their laminated films (for example, respective laminated films of silver, gold, nickel, titanium or aluminum).

The active terminal section 10c is disposed at both ends on the voltage withstand region 10b side of the active region 10a, in the direction (x-axis direction) that is perpendicular to the direction in which the gate oxide film 20 and gate electrode 21 and the p-type base region 18 and n-type source region 19 extend (the y-axis direction: see FIG. 6).

As shown in FIG. 7, in the first p-type region 13 of the active terminal section 10c, a plurality of first trench contact sections 15a, a plurality of second trench contact sections 15b and a third trench contact section 15c are disposed in the first p-type region 13.

The plurality of first trench contact sections 15a, the plurality of second trench contact sections 15b and the third trench contact section 15c are disposed in order in the direction from the voltage withstand region 10b side toward the active region 10a side (the positive direction on the x-axis: see FIG. 6), with spacings between them. The plurality of first trench contact sections 15a are disposed further toward the voltage withstand region 10b side (the negative direction on the x-axis: see FIG. 6).

As shown in FIG. 6, the plurality of first trench contact sections 15a, the plurality of second trench contact sections 15b and the third trench contact section 15c are disposed in a manner extending in the direction along the border between the active region 10a and voltage withstand region 10b (the y-axis direction).

In the semiconductor device 10, the first trench contact section 15a, the second trench contact section 15b and the third trench contact section 15c have different lengths but with the same cross-sectional shape.

As shown in FIG. 8, the plurality of first trench contact sections 15a are disposed with a spacing between them in the y-axis direction. The plurality of first trench contact sections 15a and the portions between adjacent first trench contact sections 15a form a first trench contact section region 15ar.

The plurality of first trench contact sections 15a are formed by filling the plurality of trenches in the first p-type region 13 with an electric conductor such as aluminum or an alloy composed mainly of aluminum, for example.

The portions of the source electrode 23 located on the plurality of first trench contact sections 15a function as electric conductor layers electrically connecting the respective electric conductors filled into the plurality of trenches provided in the plurality of first trench contact sections 15a.

Since the adjacent first trench contact sections 15a are separate from each other, the carrier that moves from the voltage withstand region 10b side toward the active region 10a side can move between the adjacent first trench contact sections 15a.

The ratio of the total length of each of the plurality of first trench contact sections 15a with respect to the length of the first trench contact section region 15ar in the y-axis direction may be in the range of 50% to 99%. If the ratio of the total length is 50% or greater, it will be possible to adequately move the carrier in the first p-type region 13 to the source electrode 23. If the ratio of the total length is no greater than 99%, there will be little inhibition of movement to the second trench contact section 15b side of the carrier that is moving from the voltage withstand region 10b side toward the active region 10a side.

The first trench contact section region 15ar will now be explained with reference to FIG. 10A to FIG. 10C.

Figure 10A:
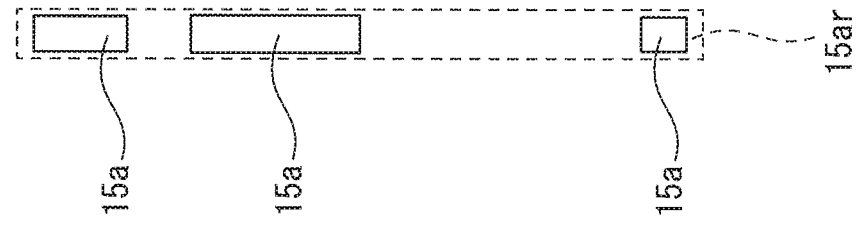
FIG. 10A is a plan view showing a first mode of the first trench contact section region.

FIG. 10A is a plan view of a first mode of the first trench contact section region 15ar. The first trench contact section region 15ar may have at least two first trench contact sections 15a. This will ensure a carrier-movable region between the two first trench contact sections 15a.

Figure 10B:
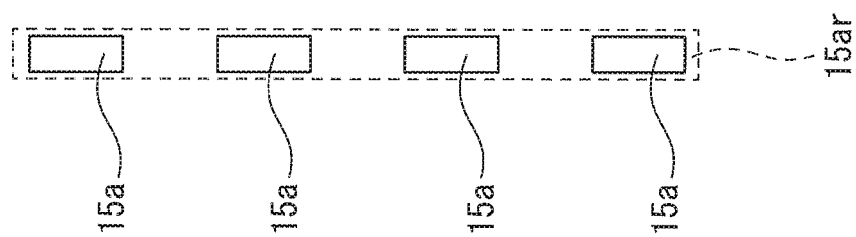
FIG. 10B is a plan view showing a second mode of the first trench contact section region.

FIG. 10B is a plan view of a second mode of the first trench contact section region 15ar. The plurality of first trench contact sections 15a may be disposed equally along the lengthwise direction of the first trench contact section region 15ar. In the example illustrated in FIG. 10B, a plurality of first trench contact sections 15a having the same dimensions are disposed at equal spacings.

Figure 10C:
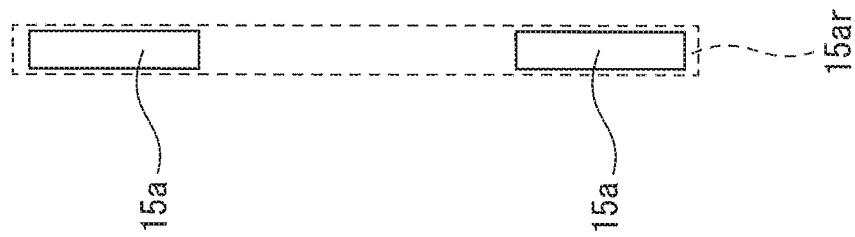
FIG. 10C is a plan view showing a third mode of the first trench contact section region.

FIG. 10C is a plan view of a third mode of the first trench contact section region 15ar. Each of the plurality of first trench contact sections 15a may also have different shapes and dimensions. The plurality of first trench contact sections 15a may also be disposed unequally along the lengthwise direction of the first trench contact section region 15ar.

As shown in FIG. 8, the plurality of second trench contact sections 15b are disposed across spacings in the y-axis direction. The plurality of second trench contact sections 15b and the portions between adjacent second trench contact sections 15b form a second trench contact section region 15br.

The plurality of second trench contact sections 15b are formed by filling the plurality of trenches in the first p-type region 13 with an electric conductor such as aluminum or an alloy composed mainly of aluminum, for example.

The portions of the source electrode 23 located on the plurality of second trench contact sections 15b function as electric conductor layers electrically connecting the respective electric conductors filled into the plurality of trenches provided in the plurality of second trench contact sections 15b.

Since the adjacent second trench contact sections 15b are separate from each other, the carrier that moves from the voltage withstand region 10b side toward the active region 10a side can move between the adjacent second trench contact sections 15b.

As shown in FIG. 8, the first trench contacts 15a and second trench contact sections 15b are disposed in a mutually differing manner Specifically, they may be disposed so that the location of the first trench contact section 15a in the y-axis direction and the location of the second trench contact section 15b in the y-axis direction do not overlap, although overlapping sections may be present.

As a result, some of the carrier that has moved from the first trench contact section 15a side will easily move to the source electrode 23 through the second trench contact section 15b.

The ratio of the total length of each of the plurality of second trench contact sections 15b with respect to the length of the second trench contact section region 15br in the y-axis direction may be in the range of 25% to 50%. If the ratio of the total length is 25% or greater, it will be possible to adequately move the carrier in the first p-type region 13 to the source electrode. If the ratio of the total length is no greater than 50%, there will be little inhibition of movement to the third trench contact section 15c side of the carrier that is moving from the voltage withstand region 10b side toward the active region 10a side.

The widths, lengths or depths of the second trench contact sections 15b may be the same as or different from the first trench contact sections 15a.

The explanation regarding the first trench contact section region 15ar with reference to FIG. 10A to FIG. 10C also applies as appropriate for the second trench contact section region 15br.

As shown in FIG. 8, the third trench contact section 15c is disposed in a manner extending continuously in the y-axis direction. Thus, the carrier that has moved through the adjacent second trench contact sections 15b to the third trench contact section 15c side is caused to move toward the source electrode 23 mainly through the third trench contact section 15c.

The plurality of third trench contact sections 15c are formed by filling the trenches in the first p-type region 13 with an electric conductor such as aluminum or an alloy composed mainly of aluminum, for example.

As shown in FIG. 7 and FIG. 8, a first $p^+$-type conductive connection region 16a having a lower resistivity than the first p-type region 13 and electrically connecting the plurality of first trench contact sections 15a and the plurality of second trench contact sections 15b, is disposed in the first p-type region 13 between the first trench contact section region 15ar and second trench contact section region 15br. The first $p^+$-type conductive connection region 16a is also disposed between the adjacent first trench contact sections 15a.

The first $p^+$-type conductive connection region 16a may be disposed between the first trench contact section region 15ar and the second trench contact section region 15br, at a section that is not adjacent to the first trench contact sections 15a. This will promote movement of the carrier, that has flowed from the voltage withstand region 10b side to the active region 10a side, toward the second trench contact section region 15br side.

In particular, the first $p^+$-type conductive connection region 16a may be disposed in the first p-type region 13, between the first trench contact section region 15ar and the second trench contact section region 15br, across the entire lengthwise direction of the first trench contact section region 15ar.

The depth of the first $p^+$-type conductive connection region 16a may be shallower than the depths of the first trench contact sections 15a and second trench contact sections 15b.

The first $p^+$-type conductive connection region 16a may be formed by having boron or aluminum, for example, added to a silicon epitaxial layer, at a higher impurity concentration than the first p-type region 13.

The sheet resistance of the first $p^+$-conductive connection region 16a may be at least 2 order smaller than the first p-type region 13. For example, if the impurity concentration of the first p-type region 13 is $5 \times 10^{15}$ to $1 \times 10^{17}$ cm$^{-3}$, the impurity concentration of the first $p^+$-conductive connection region 16a may be $1 \times 10^{18}$ to $1 \times 10^{20}$ cm$^{-3}$.

Similarly, a second $p^+$-conductive connection region 16b having lower resistivity than the first p-type region 13 and electrically connecting the plurality of second trench contact sections 15b and the third trench contact section 15c, is disposed in the first p-type region 13 between the second trench contact section region 15br and the third trench contact section 15c. The second p+-type conductive connection region 16b is also disposed between the adjacent second trench contact sections 15b.

The impurity concentration of the first p+-type conductive connection region 16a may be the same as or different from the second p+-conductive connection region 16b. For example, the impurity concentration of the first p+-type conductive connection region 16a may be higher than the second p+-type conductive connection region 16b, thus promoting movement of the carrier between the first trench contact sections 15a and the second trench contact sections 15b.

The depth of the first p+-type conductive connection region 16a may also be the same as or different from the second p+-conductive connection region 16b. For example, the depth of the first p+-type conductive connection region 16a may be deeper than the second p+-type conductive connection region 16b, thus promoting movement of the carrier between the first trench contact sections 15a and the second trench contact sections 15b.

The above explanation regarding the first p+-type conductive connection region 16a also applies as appropriate to the second p+-type conductive connection region 16b. In the semiconductor device 10, the first p+-type conductive connection region 16a and second p+-type conductive connection region 16b are formed in an integral manner.

A first p+-type region 17a of a second conductive type is disposed at the ends of the first trench contact sections 15a (the ends on the back side). Similarly, a second p+-type region 17b of the second conductive type is disposed at the ends of the second trench contact sections 15b, and a third p+-type region 17c of the second conductive type is disposed at the end of the third trench contact section 15c. The "ends" of the first trench contact sections 15a refers to the bottoms of the trenches (grooves) of the trench contact sections.

The first p+-type region 17a, second p+-type region 17b and third p+-type region 17c may be formed by having boron or aluminum, for example, added to a silicon epitaxial layer, at a higher impurity concentration than the first p-type region 13. In addition, the first p+-type region 17a, second p+-type region 17b and third p+-type region 17c may also have the same impurity concentration as the first p+-type conductive connection region 16a and second p+-type conductive connection region 16b.

The first p+-type region 17a reduces the electrical resistance between the first p-type region 13 and the first trench contact sections 15a. Similarly, the second p+-type region 17b reduces the electrical resistance between the first p-type region 13 and the second trench contact sections 15b, while the third p+-type region 17c reduces the electrical resistance between the first p-type region 13 and the third trench contact section 15c.

The semiconductor device 10 also has a fourth trench contact section 15d disposed in a manner extending continuously in the y-axis direction (see FIG. 6). The fourth trench contact section 15d is disposed running through the center of the n-type source region 19, reaching up to the p-type base region 18. A fourth p+-type region 17d is disposed at the end of the fourth trench contact section 15d. The "end" of the fourth trench contact section 15d refers to the bottom of the trench (groove) of the trench contact section, with an electric conductor embedded in the trench (groove). The electric conductor embedded in the trench (groove) of the fourth trench contact section 15d, is formed integrally with the source electrode 23 and is electrically connected to the source electrode 23.

The n-type source region 19 is electrically connected to the source electrode 23 via the electric conductor provided in the trench (groove) of the fourth trench contact section 15d.

The fourth p+-type region 17d may be formed by having boron or aluminum, for example, added to a silicon epitaxial layer, at a higher impurity concentration than the p-type base region 18. The fourth p+-type region 17d reduces the electrical resistance between the p-type base region 18 and the fourth trench contact section 15d.

In addition, as shown in FIG. 9, a fifth trench contact section 15e is disposed in the voltage withstand region 10b of the semiconductor device 10, electrically connecting the gate runner 25 and the gate electrode 21. A fifth p+-type region 17e is disposed at the end of the fifth trench contact section 15e. The "end" of the fifth trench contact section 15e refers to the bottom of the trench (groove) of the trench contact section, with an electric conductor embedded in the trench (groove).

The fifth p+-type region 17e may be formed by having boron or aluminum, for example, added to a silicon epitaxial layer, at a higher impurity concentration than the second p-type region 14. The fifth p+-type region 17e reduces the electrical resistance between the second p-type region 14 and the fifth trench contact section 15e. The first p-type region 13 has a narrowed width so as not to overlap with the fifth p+-type region 17e.

In addition, as shown in FIG. 7, a sixth trench contact section 15f is disposed in the voltage withstand region 10b of the semiconductor device 10, being disposed in a manner extending continuously in the y-axis direction (see FIG. 6). The sixth trench contact section 15f is formed integrally with the field plate 26, and is electrically connected to the field plate 26.

A sixth p+-type region 17f is disposed at the end of the sixth trench contact section 15f. The "end" of the sixth trench contact section 15f refers to the bottom of the trench (groove) of the trench contact section, with an electric conductor embedded in the trench (groove). The sixth p+-type region 17f may be formed by having boron or aluminum, for example, added to a silicon epitaxial layer, at a higher impurity concentration than the third p-type region 27. The sixth p+-type region 17f reduces the electrical resistance between the third p-type region 27 and the sixth trench contact section 15f.

The n+-type silicon substrate 11 and n−-type drift layer 12, the p-type base region 18, the n-type source region 19, and the gate oxide film 20 and gate electrode 21, form MOSFETs that extend in the y-axis direction.

In the active region 10a, the MOSFETs are disposed periodically in the x-axis direction. The active terminal section 10c is located in the active region 10a between the element region and the voltage withstand region 10b, with the plurality of MOSFETs disposed periodically in the x-axis direction.

During operation of the semiconductor device 10, a gate voltage is applied to the gate electrode 21 through the gate runner 25 and the fifth trench contact section 15e. A source voltage is also applied to the n-type source region 19 through the source electrode 23 and the fourth trench contact section 15d. In addition, a drain voltage is applied to the n+-silicon substrate 11 through the drain electrode 24. ON and OFF operation of each MOSFET is controlled by application of a gate voltage to the gate electrode 21.

A voltage that is the same as the drain voltage, for example, may also be applied to the third p-type region 27 through the field plate 26 and the sixth trench contact section 15f.

In the semiconductor device 10, a high electric field is easily generated at the outermost periphery of the active region 10a when the semiconductor element is ON or OFF. The voltage withstand region 10b moderates the electric field generated at the outermost periphery of the active region 10a. The active terminal section 10c also functions to moderate the generated electric field.

The gate runner 25 of the voltage withstand region 10b is disposed separately from the source electrode 23 of the active region 10a. The gate runner 25 and field plate 26 of the voltage withstand region 10b are electrically insulated from the source electrode 23. The voltage from the source electrode 23 and gate electrode 21 disposed on the front side of the semiconductor device 10 (the voltage controlling operation of the semiconductor element) is not directly applied to the n$^-$-type drift layer 12 and third p-type region 27 of the voltage withstand region 10b.

When the semiconductor device 100 is OFF, a depletion layer may be formed in the pn junction region between the p-type region including the first p-type region 13, the second p-type region 14, the p-type base region 118 and the third p-type region 27, and the n$^-$-type drift layer 12.

The carrier accumulated in the depletion layer is able to move to the source electrode 23 or field plate 26, via the first p$^+$-type region 17a to sixth p$^+$-type region 17f and the first trench contact section 15a to sixth trench contact section 15f. This causes parasitic bipolar operation to be inhibited when the semiconductor device 10 is OFF, thus increasing the tolerance to avalanche breakdown.

The carrier produced by inductive load or recovery current is concentrated at the active terminal section 10c, which is the end of the active region 10a on the voltage withstand region 10b side.

The plurality of first trench contact sections 15a, plurality of second trench contact sections 15b and third trench contact section 15c are disposed on the active terminal section 10c of the semiconductor device 10, allowing conduction of a large current to the source electrode 23.

As further explanation, when the semiconductor device 10 operation is ON, as the width of the depletion layer that was being formed during OFF decreases, the carrier that was accumulating in the depletion layer on the front side of the active terminal section 10c is drawn into the source electrode 23 via the first trench contact section 15a to third trench contact section 15c, as shown in FIG. 8. Similarly, the carrier that was accumulating in the depletion layer on the back side is drawn into the drain electrode 24.

In the semiconductor device 10, the first trench contact section region 15ar located furthest to the voltage withstand region 10b side has a plurality of first trench contact sections 15a that are disposed in a mutually separated manner, and therefore the carrier that has flowed from the voltage withstand region 10b side to the active region 10a side easily moves to the second trench contact section region 15br side. In addition, since the second trench contact section region 15br also has a plurality of second trench contact sections 15b disposed in a mutually separated manner, the carrier that has flowed from the first trench contact section 15a side easily flows to the third trench contact section 15c side. The carrier that has flowed from the voltage withstand region 10b side to the active region 10a side moves to the source electrode 23 through the plurality of first trench contact sections 15a, the plurality of second trench contact sections 15b and the third trench contact section 15c.

As a result, the carrier that has flowed from the voltage withstand region 10b side to the active region 10a side is kept from concentrating in the first trench contact sections 15a or second trench contact sections 15b, thus preventing heating of the first trench contact sections 15a or second trench contact sections 15b.

In the semiconductor device of the embodiment described above, the carrier that has flowed from the voltage withstand region 10b side to the active region 10a side is inhibited from concentrating in the first trench contact sections 15a or second trench contact sections 15b, and therefore the tolerance to inductive load and recovery current is improved.

In the first embodiment described above, incidentally, the first p$^+$-type conductive connection region 16a was disposed in the active terminal section 10c, between the first trench contact sections 15a and the second trench contact sections 15b, and the second p$^+$-type conductive connection region 16b was disposed between the second trench contact sections 15b and the third trench contact section 15c, but the second p$^+$-type conductive connection region 16b does not need to be provided.

Another embodiment of the semiconductor device described above will now be described with reference to FIG. 11 to FIG. 13. The detailed explanation provided for the first embodiment applies for any aspects of this additional embodiment that are not explained here. The same reference numerals are also used for corresponding constituent elements.

Figure 11:
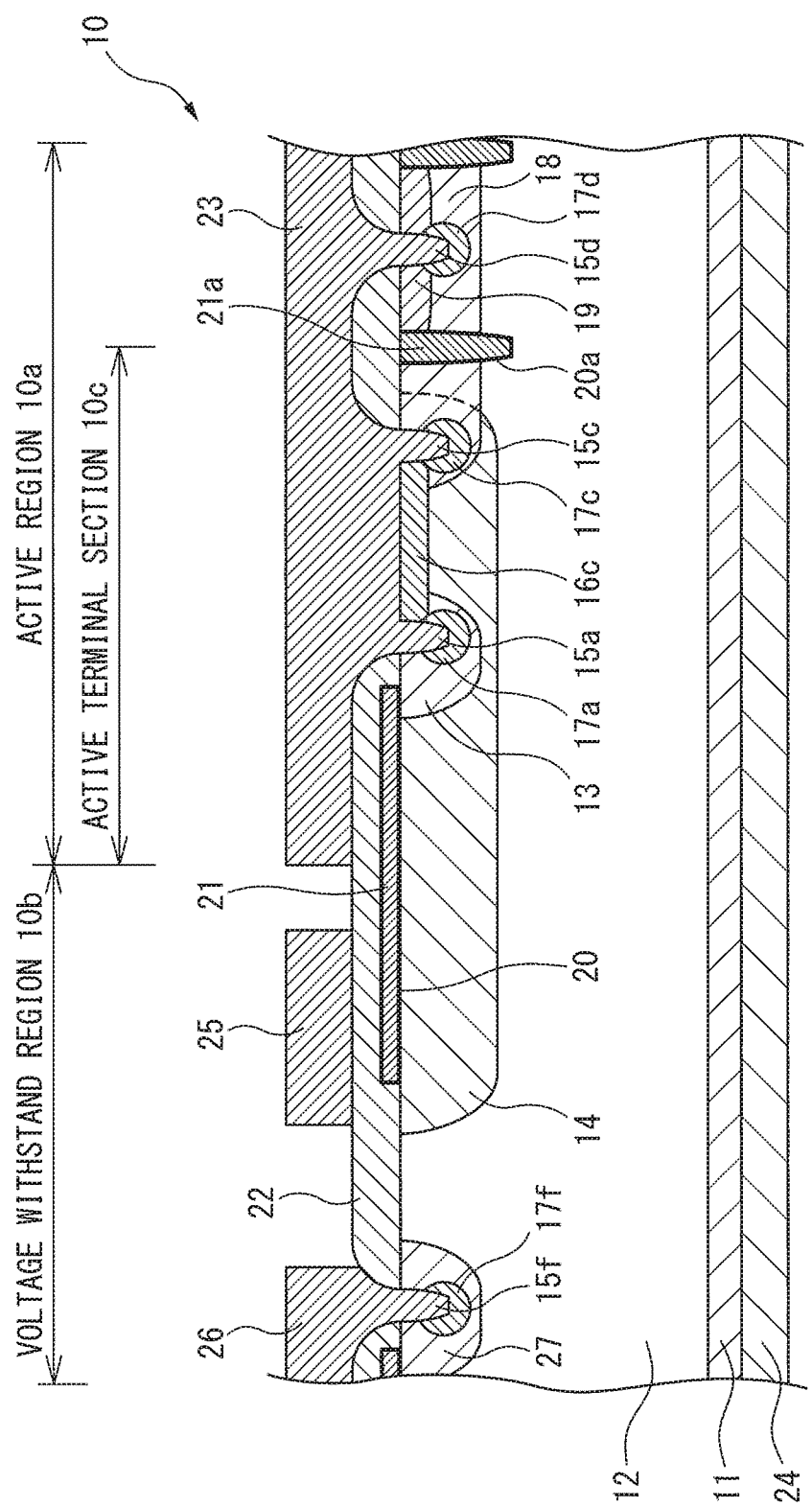
FIG. 11 is a cross-sectional view showing a second embodiment of the semiconductor device disclosed herein.

FIG. 11 is a cross-sectional view showing a second embodiment of the semiconductor device disclosed herein. FIG. 11 is a cross-sectional view corresponding to FIG. 7 of the first embodiment described above.

The semiconductor device of this embodiment differs from the first embodiment in that it has a trench-type gate electrode 21a. The gate electrode 21a is disposed in a manner extending through the p-type base region 18 and up to the n$^-$-type drift layer 12. The gate oxide film 20a is disposed in a manner covering the side walls and base of the gate electrode 21a.

In the active terminal section 10c, the plurality of first trench contact sections 15a and the third trench contact section 15c are disposed in the second p-type region 14. In the active terminal section 10c, incidentally, a plurality of second trench contact sections 15b may be provided, as according to the first embodiment described above.

The first p-type region 13 is disposed inside the second p-type region 14, in a manner including the plurality of first trench contact sections 15a and the first p$^+$-type region 17a.

The p-type base region 18 includes the third trench contact section 15c and the third p$^+$-type region 17c, and it extends toward the voltage withstand region 10b side in such a manner as to partially overlap with the second p-type region 14. When a trench-type gate electrode 21a is provided, the gate electrode 21 (polysilicon with a gate potential) and the gate insulating film 20 are disposed under the interlayer dielectric film 22 that is on the voltage withstand region 10b side of the first trench contact sections 15a. The gate electrode 21 is formed simultaneously with the trench-type gate electrode 21a. The trench-type gate electrode 21a and gate electrode 21 are electrically connected (not shown). The gate electrode 21 and gate runner 25 are also electrically connected (not shown).

The plurality of first trench contact sections 15a are disposed in a mutually separated manner extending in the y-axis direction, similar to the first embodiment.

The third trench contact section 15c is disposed in a manner extending continuously in the y-axis direction (see FIG. 6), similar to the first embodiment.

A p⁺-type conductive connection region 16c, having a lower resistivity than the second p-type region 14 and electrically connecting the plurality of first trench contact sections 15a and the third trench contact section 15c, is disposed in the second p-type region 14 between the plurality of first trench contact sections 15a and the third trench contact section 15c.

The p⁺-type conductive connection region 16c may be formed by having boron or aluminum, for example, added to a silicon epitaxial layer, at a higher impurity concentration than the second p-type region 14.

The semiconductor device of this embodiment can exhibit the same effect as the first embodiment described above.

Figure 12:
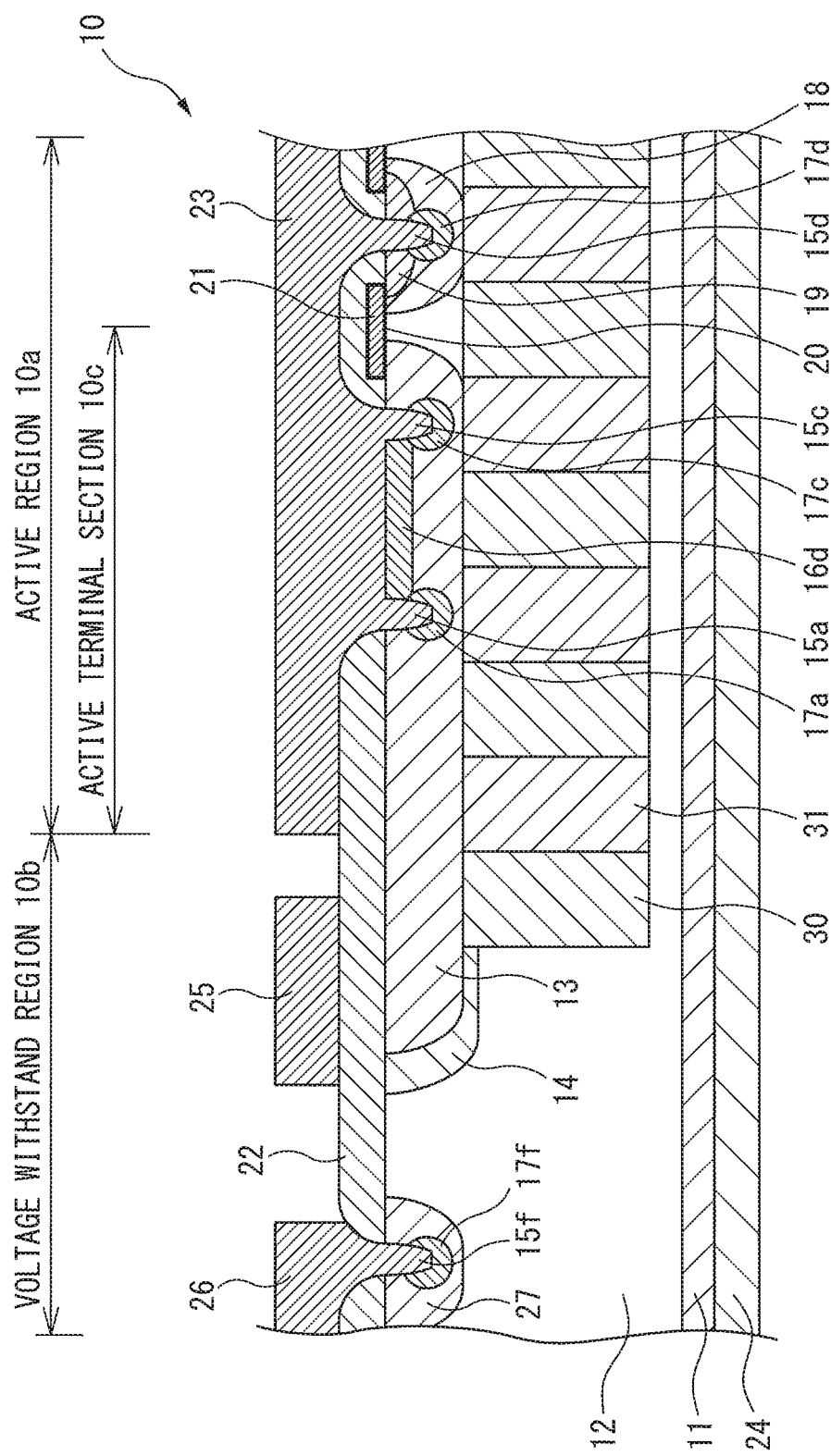
FIG. 12 is a cross-sectional view showing a third embodiment of the semiconductor device disclosed herein.

FIG. 12 is a cross-sectional view showing a third embodiment of the semiconductor device disclosed herein.

FIG. 12 is a cross-sectional view corresponding to FIG. 7 of the first embodiment described above.

The active terminal section 10c of the semiconductor device 10 of this embodiment differs from the first embodiment in that the plurality of first trench contact sections 15a and the third trench contact section 15c are disposed in the first p-type region 13, and second trench contact sections are not provided. It also differs from the first embodiment in that it has a parallel pn structure in which n-type columns 30 of the first conductive type and p-type columns 31 of the second conductive type are disposed in the n⁻-type drift layer 12, in an alternating repeating manner along the x-axis direction.

A p⁺-type conductive connection region 16d having lower resistivity than the second p-type region 14 and electrically connecting the plurality of first trench contact sections 15a and the third trench contact section 15c, is disposed in the second p-type region 14 between the plurality of first trench contact sections 15a and the third trench contact section 15c. In the active terminal section 10c, incidentally, a plurality of second trench contact sections 15b may be provided, as according to the first embodiment described above.

The p⁺-type conductive connection region 16d may be formed by having boron or aluminum, for example, added to a silicon epitaxial layer, at a higher impurity concentration than the first p-type region 13.

The n-type columns 30 and p-type columns 31 are disposed in a manner extending from the back side toward the front side of the semiconductor device 10.

The n-type columns 30 and p-type columns 31 are also disposed in a manner extending in the y-axis direction (see FIG. 6).

The n-type columns 30 may be disposed under the gate electrode 21. The p-type columns 31 may be disposed under the p-type base region 18.

The n-type columns 30 may be formed with addition of phosphorus or arsenic, for example, to the silicon epitaxial layer, at a higher impurity concentration than the n⁻-type drift layer 12.

The p-type columns 31 may be formed with addition of boron or aluminum, for example, to the silicon epitaxial layer, at about the same impurity concentration as the n-type columns 30.

When the semiconductor device 10 is OFF, all of the columns of the parallel pn structure are depleted by low voltage when the depletion layer expands from the pn junctions between each of the columns in the parallel pn structure, and therefore the semiconductor device 10 can exhibit low on-resistance as well as high voltage resistance.

In addition, the semiconductor device of this embodiment can exhibit the same effect as the first embodiment described above.

Figure 13:
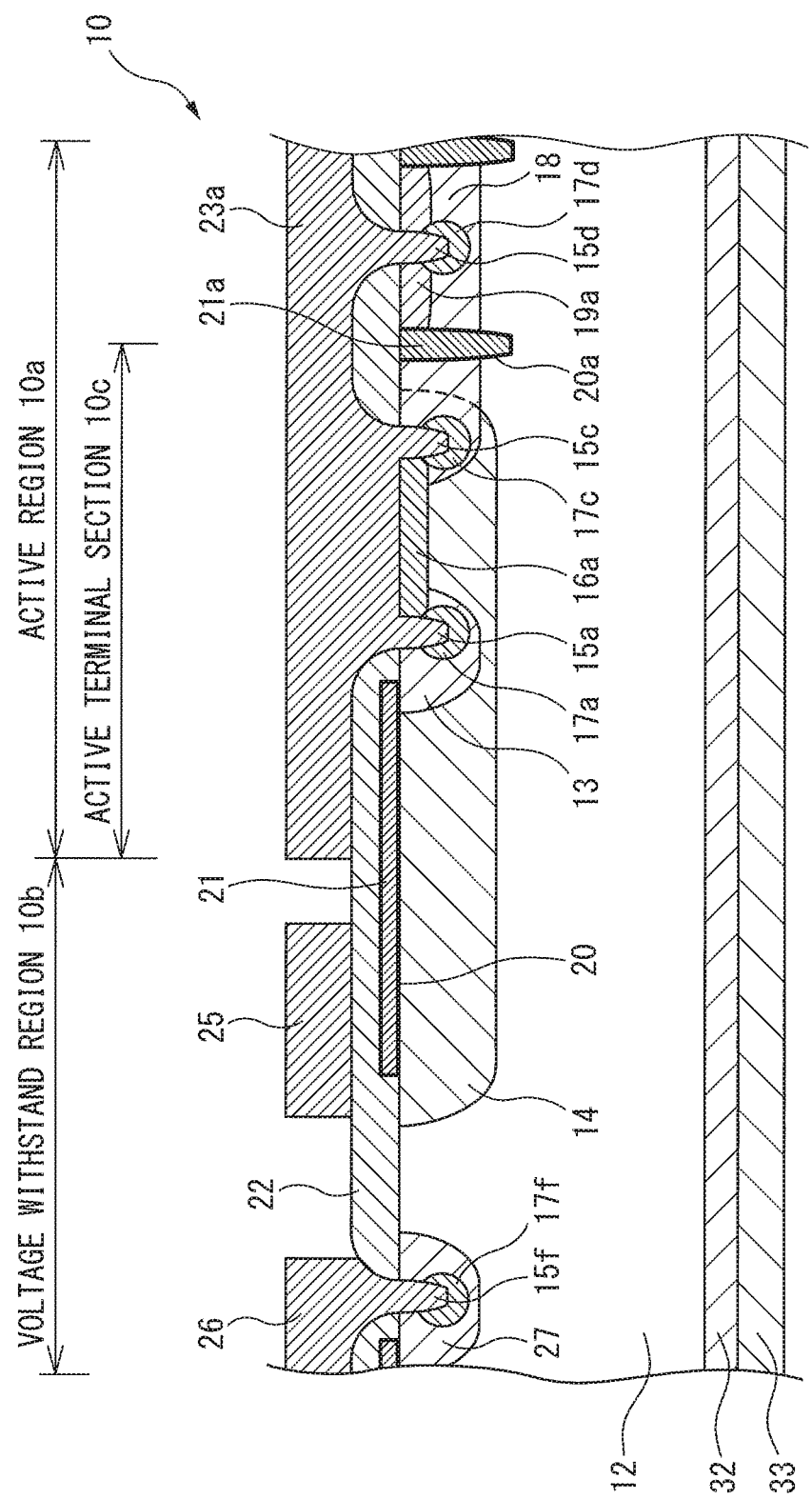
FIG. 13 is a cross-sectional view showing a fourth embodiment of the semiconductor device disclosed herein.

FIG. 13 is a cross-sectional view showing a fourth embodiment of the semiconductor device disclosed herein. FIG. 13 is a cross-sectional view corresponding to FIG. 7 of the first embodiment described above.

The semiconductor device 10 of this embodiment has an IGBT (Insulated Gate Bipolar Transistor) as the semiconductor element.

The p-type collector region 32 of the second conductive type, and an n⁻-type drift layer 12, the p-type base region 18, an n-type emitter region 19a, and the gate oxide film 20a and gate electrode 21a form an IGBT that extends in the y-axis direction (see FIG. 6). The p-type collector region 32 may be formed with addition of an impurity that imparts polarity of the second conductive type, such as boron or aluminum, to a silicon epitaxial layer, with the n⁻-type drift layer 12 as the silicon substrate. Alternatively, the p-type collector region 32 may have, as the silicon substrate, an n⁻-type drift layer 12 formed by layering a silicon epitaxial layer to which phosphorus or arsenic, for example, has been added, onto a silicon substrate.

Voltage is applied from an emitter electrode 23a to the n-type emitter region 19a, via the fourth trench contact section 15d.

Voltage is applied to the p-type collector region 32 from a collector electrode 33. The rest of the construction of the semiconductor device 10 is the same as the second embodiment described above. When a trench-type gate electrode 21a is provided, the gate electrode 21 (polysilicon with a gate potential) and the gate insulating film 20 are disposed under the interlayer dielectric film 22 that is on the voltage withstand region 10b side of the first trench contact sections 15a. The gate electrode 21 is formed simultaneously with the trench-type gate electrode 21a. The trench-type gate electrode 21a and gate electrode 21 are electrically connected (not shown). The gate electrode 21 and gate runner 25 are also electrically connected (not shown).

The semiconductor device of this embodiment can exhibit the same effect as the first embodiment described above.

A preferred embodiment of the semiconductor device manufacturing method disclosed herein will now be explained with reference to FIG. 14 to FIG. 20.

The semiconductor device manufacturing method of this embodiment for forming the main parts of the semiconductor device of the first embodiment will now be explained.

Figure 14:
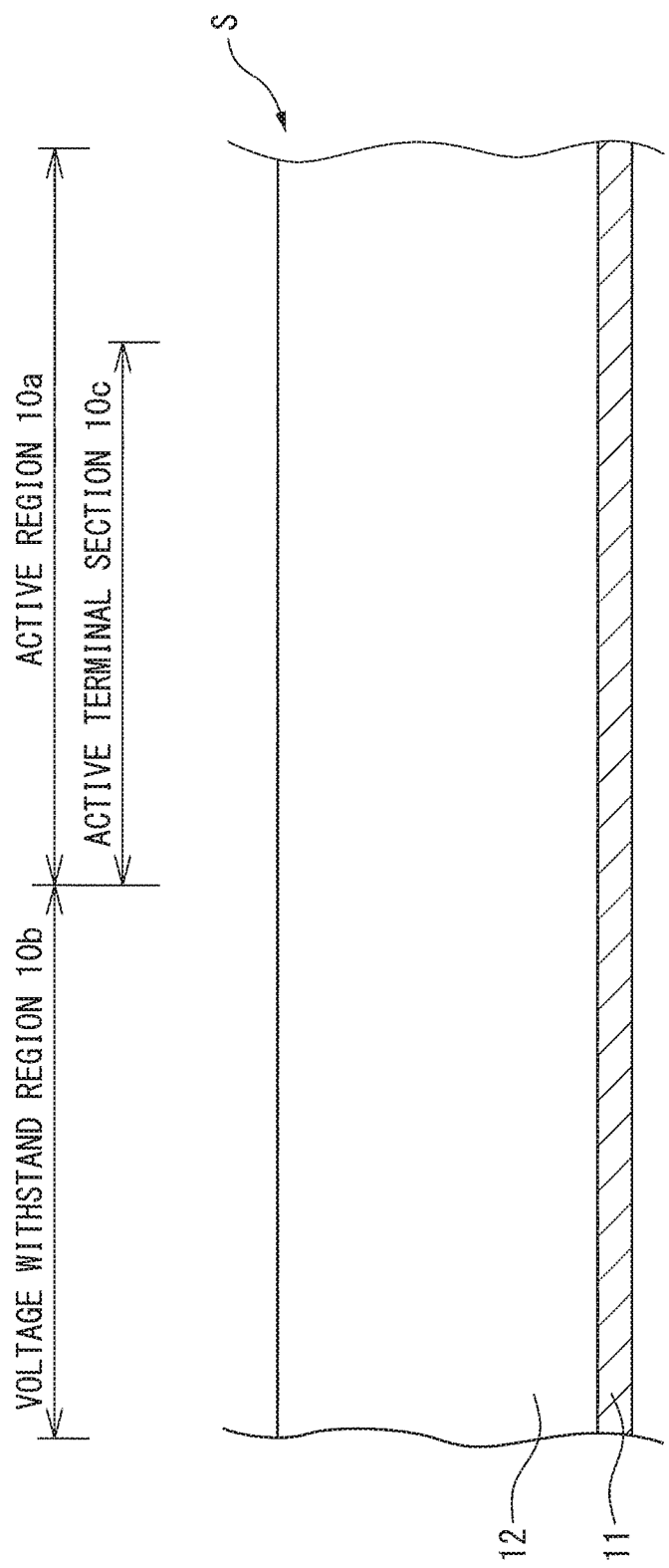
FIG. 14 is a diagram illustrating the step of one embodiment of the semiconductor device manufacturing method disclosed herein (1).

First, as shown in FIG. 14, a substrate structure S is prepared having an n⁺-type silicon substrate 11 and an n⁻-type drift layer 12 disposed on the n⁺-type silicon substrate 11. The drawings depict the regions of the active region 10a, the voltage withstand region 10b and the active terminal section 10c when the substrate structure S has later become a semiconductor device. For convenience in the following explanation, the term "active region 10a", "voltage withstand region 10b" or "active terminal section 10c" will be used when indicating the regions of the substrate structure S.

Figure 15:
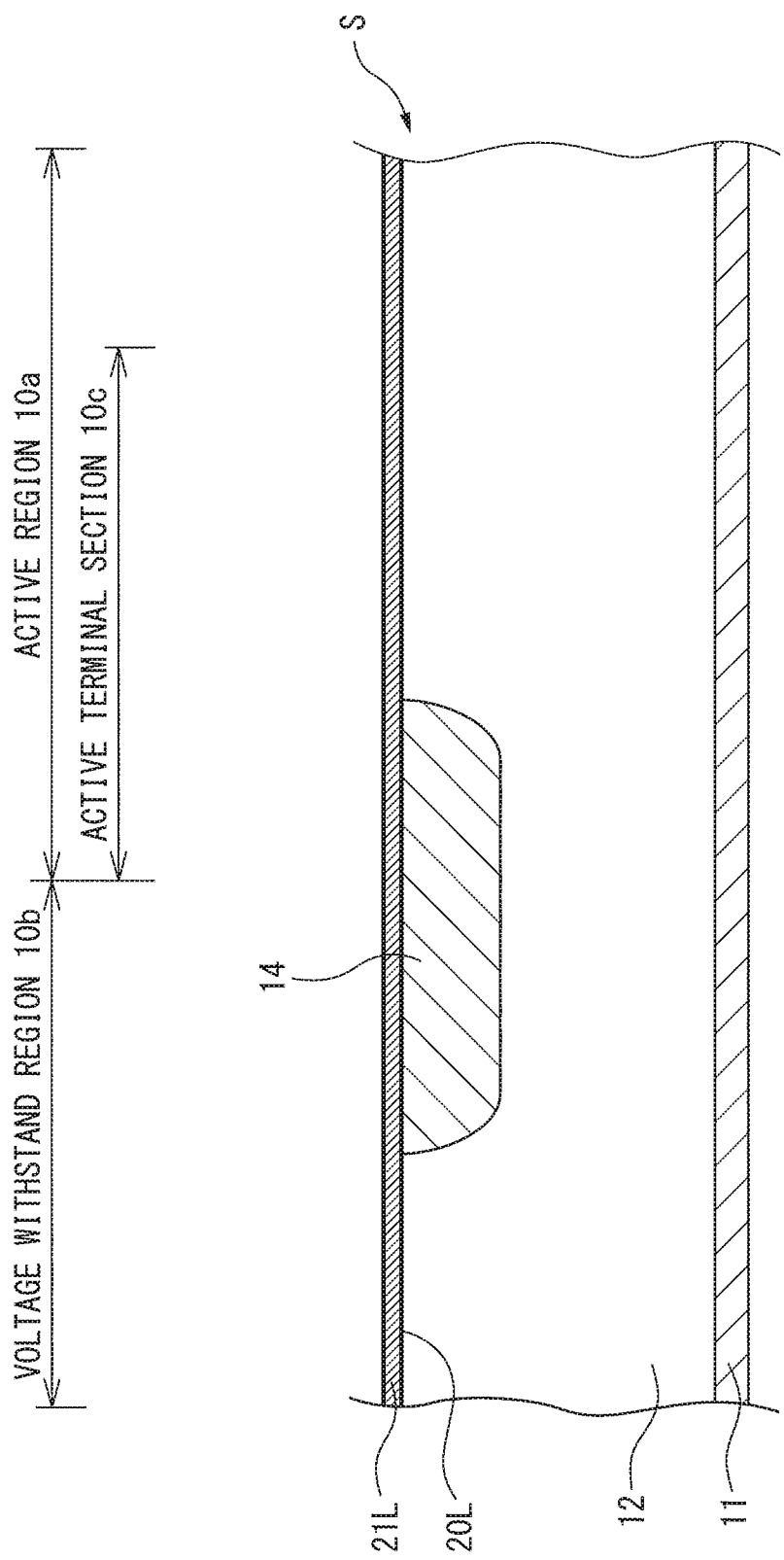
FIG. 15 is a diagram illustrating the step of one embodiment of the semiconductor device manufacturing method disclosed herein (2).

As shown in FIG. 15, the second p-type region 14 is selectively formed on the front side of the n⁻-type drift layer 12 in a manner straddling from the voltage withstand region 10b to the active region 10a. The second p-type region 14 may be formed by ion implantation of an impurity that imparts polarity of a second conductive type, such as boron or aluminum, for example, from the surface of the n⁻-type drift layer 12 to a predetermined depth, and heat treatment.

A gate oxide film 20L and gate electrode layer 21L are also formed on the n⁻-type drift layer 12 of the substrate structure S.

Figure 16:
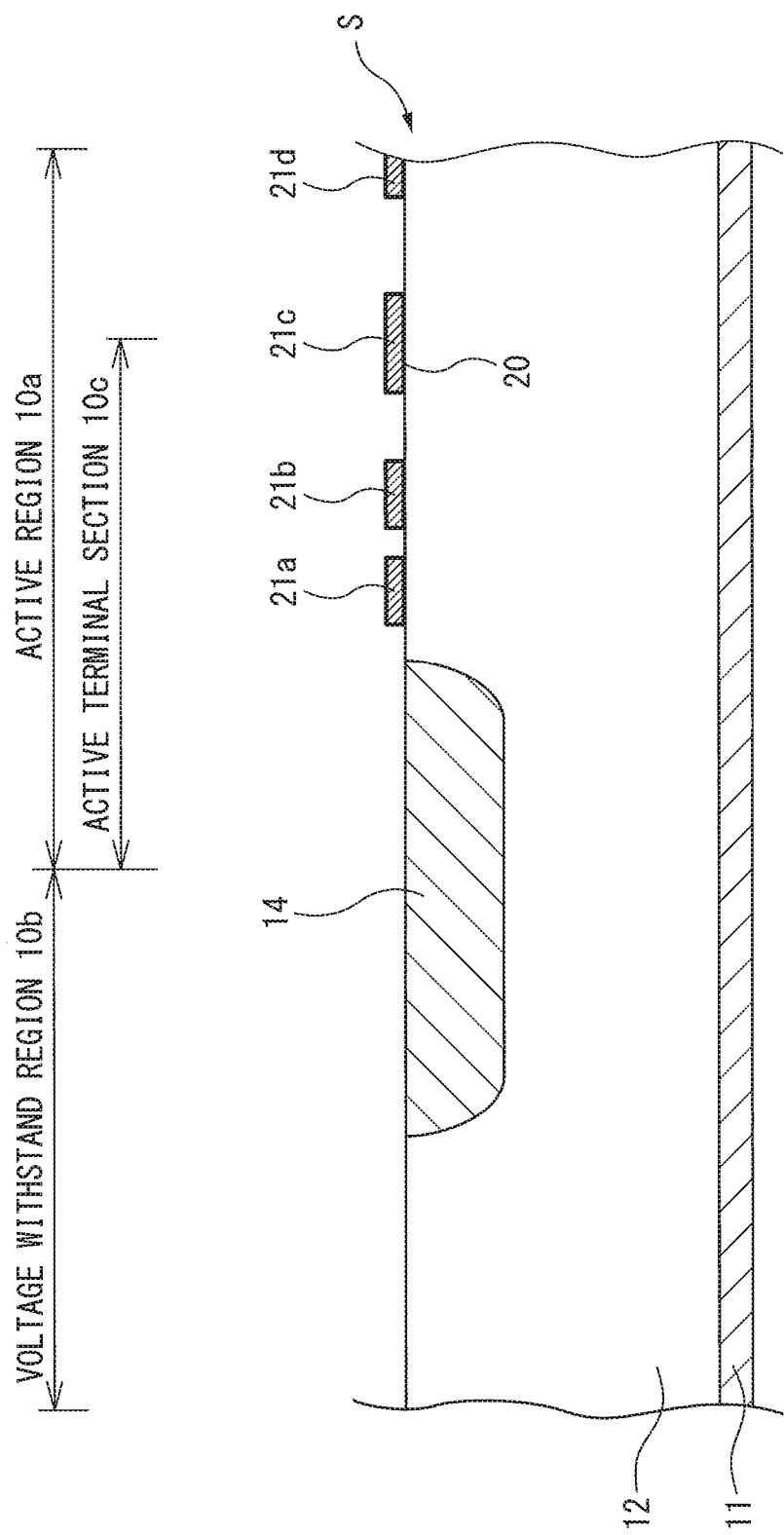
FIG. 16 is a diagram illustrating the step of one embodiment of the semiconductor device manufacturing method disclosed herein (3).

Next, as shown in FIG. 16, a gate oxide film 20L and gate electrode layer 21L are patterned using a lithographic technique, forming individual gate electrodes 21a, 21b, 21c, 21d. The gate oxide film 20 remains between the individual gate electrode 21a, 21b, 21c, 21d and the n⁻-type drift layer 12.

Figure 17:
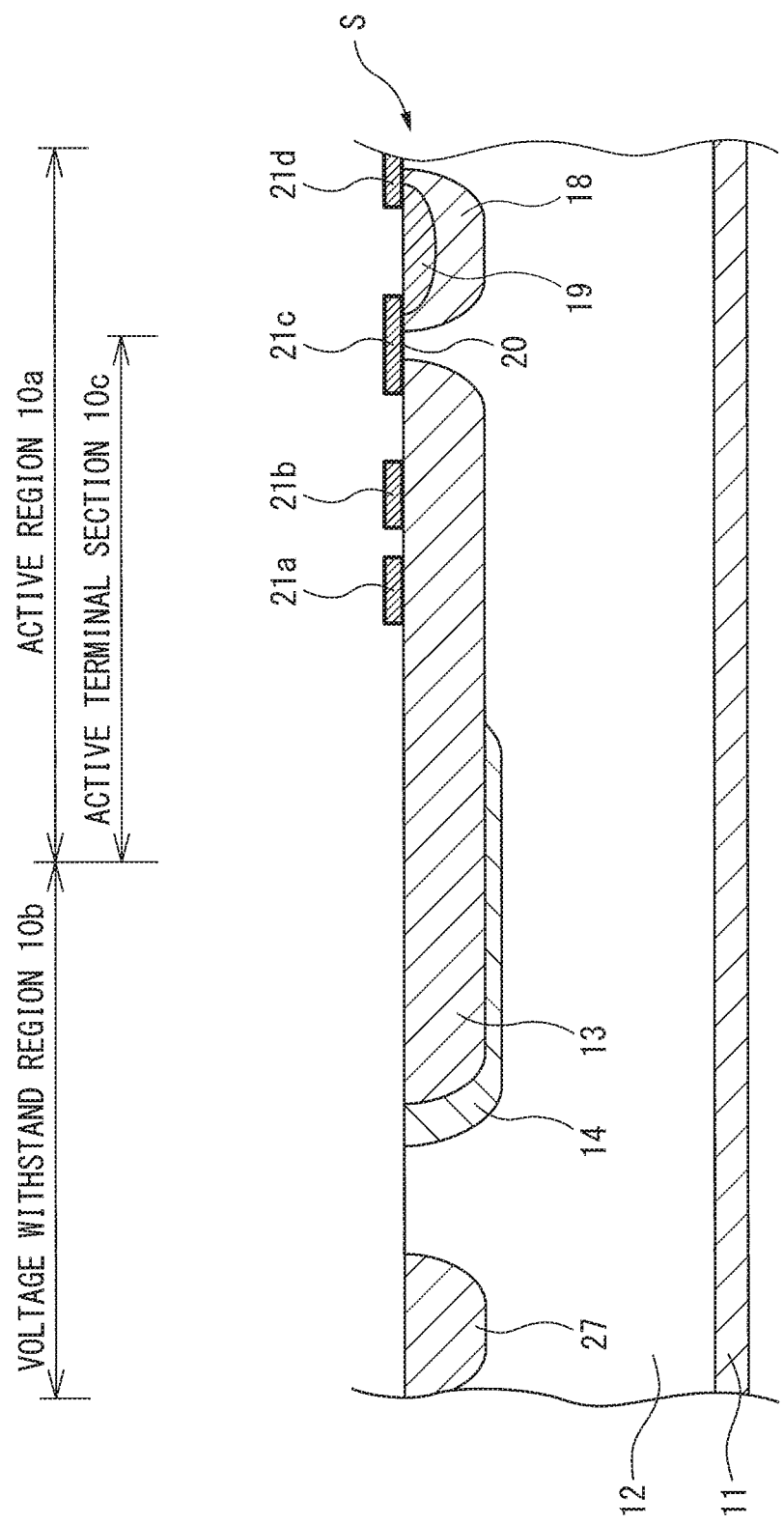
FIG. 17 is a diagram illustrating the step of one embodiment of the semiconductor device manufacturing method disclosed herein (4).

Next, as shown in FIG. 17, a first p-type region 13, p-type base region 18 and third p-type region 27 are selectively formed on the front side of the n⁻-type drift layer 12. The first p-type region 13, p-type base region 18 and third p-type region 27 may be formed by ion implantation of an impurity that imparts polarity of the second conductive type, such as boron or aluminum, for example, from the surface of the n⁻-type drift layer 12 to a predetermined depth, and heat treatment. In FIG. 17, the back side of the first p-type region 13 is illustrated in a linear form, but since the injection rate of impurities is reduced below the gate electrodes 21a, 21b, they are sometimes shallower than the locations that are not covered by the gate electrodes 21a, 21b.

Also, the n-type source region 19 is selectively formed on the front side of the n⁻-type drift layer 12. The n-type source region 19 may be formed by ion implantation of an impurity that imparts polarity of a first conductive type, such as phosphorus or arsenic, for example, from the surface of the n⁻-type drift layer 12 to a predetermined depth, and heat treatment.

Figure 18:
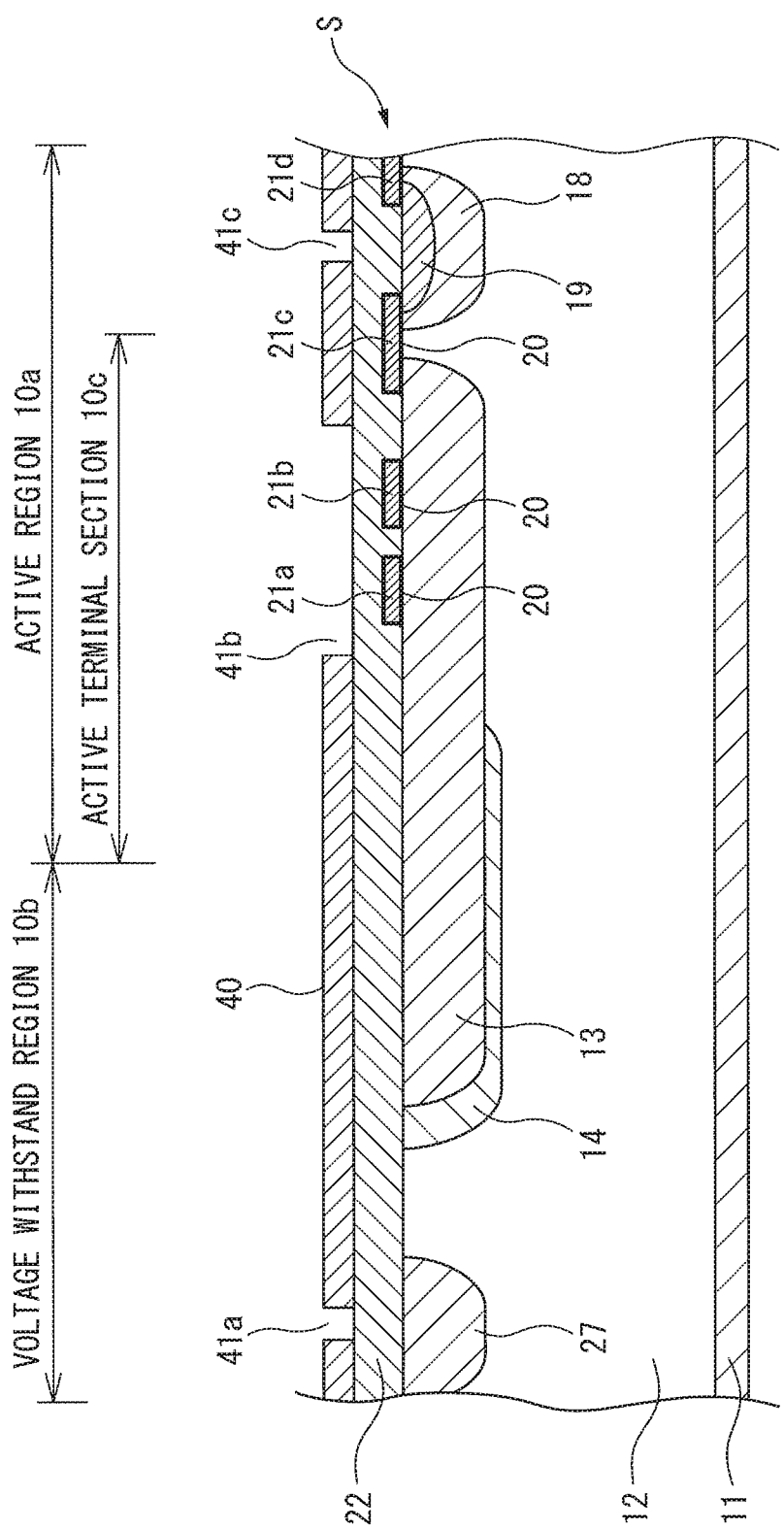
FIG. 18 is a diagram illustrating the step of one embodiment of the semiconductor device manufacturing method disclosed herein (5).

Next, as shown in FIG. 18, the interlayer dielectric film 22 is formed on the n⁻-type drift layer 12. A resist film 40 is also formed on the interlayer dielectric film 22. The resist film 40 has openings 41a, 41b, 41c. The interlayer dielectric film 22 is exposed through the openings 41a, 41b, 41c.

Figure 19:
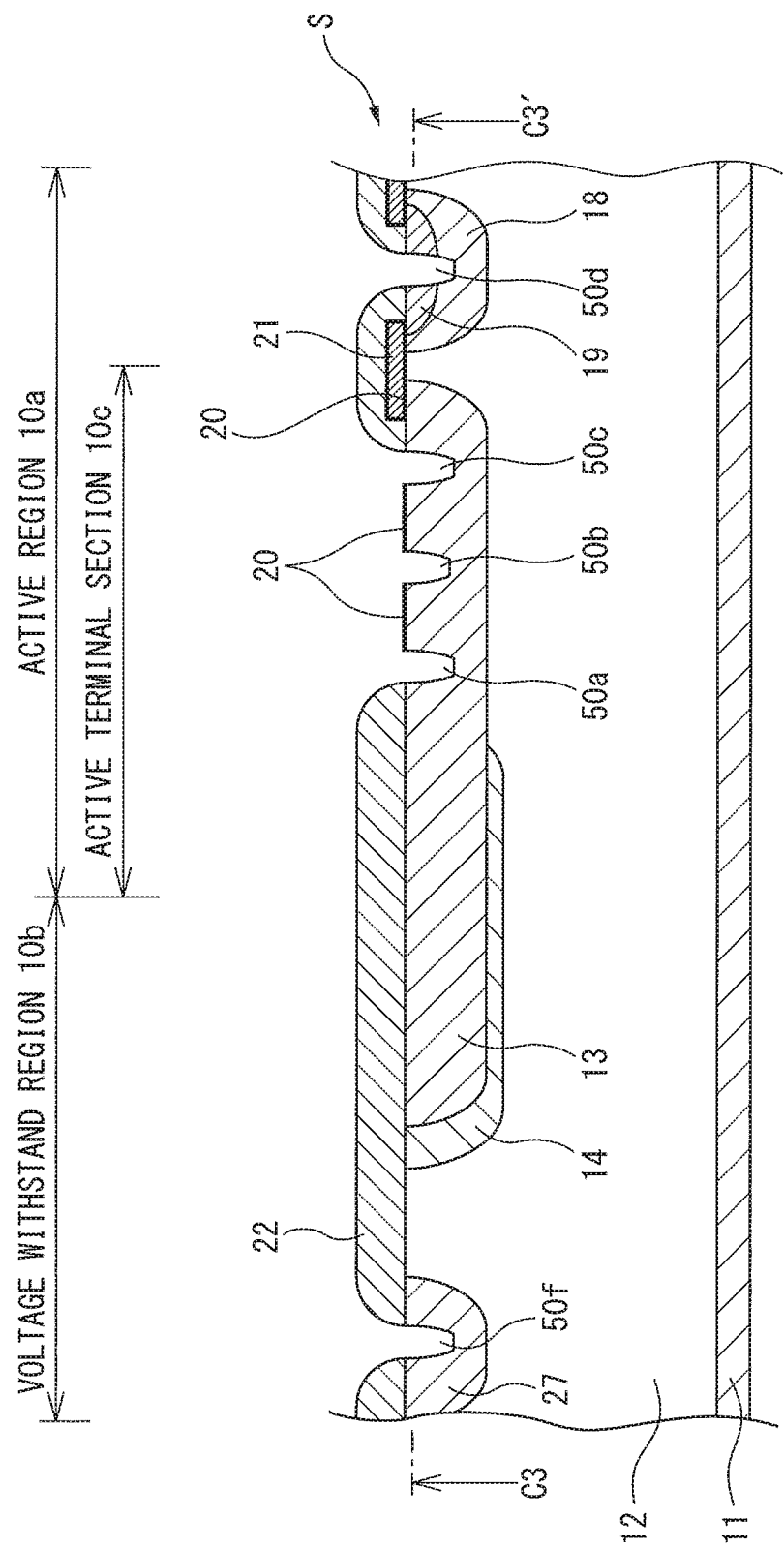
FIG. 19 is a diagram illustrating the step of one embodiment of the semiconductor device manufacturing method disclosed herein (6).

Next, as shown in FIG. 19, the interlayer dielectric film 22 exposed through the opening 41a is etched using a dry etching technique, after which the third p-type region 27 is further etched, forming a trench 50f. Similarly, the interlayer dielectric film 22 exposed through the opening 41b is etched, after which the first p-type region 13 that is not covered by the gate electrodes 21a, 21b and gate oxide film 20 is etched, forming trenches 50a, 50b, 50c. Similarly, the interlayer dielectric film 22 exposed through the opening 41c is etched, after which the n-type source region 19 and p-type base region 18 are further etched, forming a trench 50d. The resist film 40 remaining on the interlayer dielectric film 22 is removed away.

Since the gate electrodes 21a, 21b and gate oxide film 20 function as masks when the trenches 50a, 50b, 50c are formed, they prevent etching of the first p-type region 13 located under the gate electrodes 21a, 21b and gate oxide film 20.

In FIG. 19, the gate oxide films 20 which were under the gate electrodes 21a, 21b remains when the trenches 50a, 50b, 50c is formed, but the gate oxide film 20 may instead be removed by etching.

Figure 20:
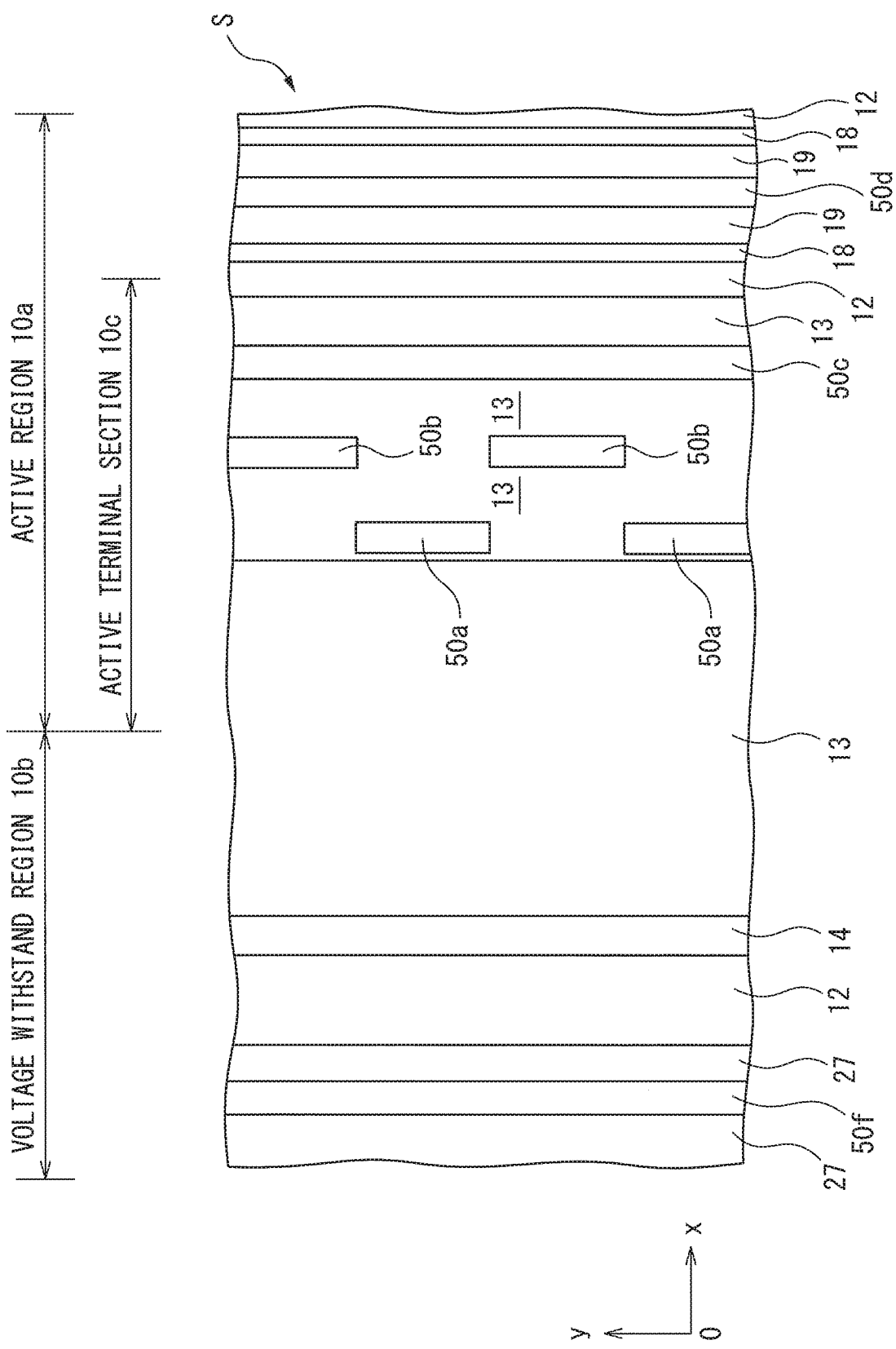
FIG. 20 is a partial plan view along line C3-C3' of FIG. 19.

FIG. 20 is a partial plan view along line C3-C3' of FIG. 19. At the active terminal section 10c, there are formed a plurality of trenches 50a disposed in a mutually separated manner extending in the y-axis direction (see FIG. 6), and a plurality of trenches 50b extending in the y-axis direction on the opposite side from the voltage withstand region 10b with respect to the plurality of trenches 50a and across spacings with the plurality of trenches 50a.

At the active terminal section 10c there is also formed a trench 50c extending in the y-axis direction, on the side opposite from the voltage withstand region 10b with respect to the plurality of trenches 50b and across a spacing with the plurality of trenches 50b.

In addition, in the active region 10a there is formed a trench 50d extending continuously in the y-axis direction and in the voltage withstand region 10b there is formed a trench 50f extending continuously in the y-axis direction.

Next, the first p⁺-type region 17a to sixth p⁺-type region 17f, the first p⁺-type conductive connection region 16a and the second p⁺-type conductive connection region 16b are formed, as shown in FIG. 7. The first p⁺-type region 17a to third p⁺-type region 17c may be formed by ion implantation of an impurity that imparts polarity of the second conductive type, such as boron or aluminum, for example, from the bases of the trenches 50a to 50c to a predetermined depth, and heat treatment. The first p⁺-type conductive connection region 16a can be formed, together with the first p⁺-type region 17a to third p⁺-type region 17c, by ion implantation of an impurity that imparts polarity of the second conductive type, such as boron or aluminum, for example, from the surface of the first p-type region 13 to a predetermined depth and across from the plurality of trenches 50a to the plurality of trenches 50b, and heat treatment. The second p⁺-type conductive connection region 16b may be formed, together with the first p⁺-type conductive connection region 16a, by ion implantation of an impurity that imparts polarity of the second conductive type, such as boron or aluminum, for example, from the surface of the first p-type region 13 to a predetermined depth and across from the plurality of trenches 50b to the trench 50c, and heat treatment.

The fourth p⁺-type region 17d may be formed by ion implantation of an impurity that imparts polarity of the second conductive type, such as boron or aluminum, for example, from the base of the trench 50d to a predetermined depth, and heat treatment. The sixth p⁺-type region 17f may be formed by ion implantation of an impurity that imparts polarity of the second conductive type, such as boron or aluminum, for example, from the base of the trench 50f to a predetermined depth, and heat treatment. While not shown here, the fifth p⁺-type region 17e is formed in the same manner.

For this embodiment, the first p⁺-type region 17a to sixth p⁺-type region 17f, the first p⁺-type conductive connection region 16a and the second p⁺-type conductive connection region 16b are formed simultaneously.

Also, an electric conductor is filled into the plurality of trenches 50a, forming the plurality of first trench contact sections 15a, and an electric conductor is filled into the plurality of trenches 50b, forming the plurality of second trench contact sections 15b. Similarly, an electric conductor is filled into the trench 50c, trench 50d and trench 50f, forming the third trench contact section 15c to sixth trench contact section 15f. The first trench contact section 15a to sixth trench contact section 15f are formed by filling the trenches with aluminum or an alloy composed mainly of aluminum, for example, using a sputtering method.

After the barrier metal layer has been formed inside the plurality of trenches 50a, the plurality of trenches 50b, the trench 50c, the trench 50d and the trench 50f, a plug metal such as tungsten may be filled into the plurality of trenches 50a, the plurality of trenches 50b, the trench 50c, the trench 50d and the trench 50f, to form the first trench contact section 15a to sixth trench contact section 15f. This allows the interiors of the trenches that have a high aspect ratio, to be filled with the electric conductor without forming gaps.

Also, a source electrode 23 is formed in the active region 10a and a gate runner 25 and field plate 26 are formed in the voltage withstand region 10b.

The source electrode 23 is formed on the plurality of first trench contact sections 15a and the plurality of second trench contact sections 15b, in a manner electrically connecting the plurality of first trench contact sections 15a together and the plurality of second trench contact sections 15b together. The source electrode 23 is formed on the third trench contact section 15c and the fourth trench contact section 15d in a manner electrically connecting together the third trench contact section 15c and the fourth trench contact section 15d. The source electrode 23 may also be formed simultaneously with the first trench contact section 15a to fourth trench contact section 15d.

The gate runner 25 is formed on the fifth trench contact section 15e, in a manner electrically connecting with the fifth trench contact section 15e. The gate runner 25 may also be formed simultaneously with the fifth trench contact section 15e.

The field plate 26 is formed on the sixth trench contact section 15f, in a manner electrically connecting with the sixth trench contact section 15f. The field plate 26 may also be formed simultaneously with the sixth trench contact section 15f.

The drain electrode 24 is formed on the back side of the $n^+$-type silicon substrate 11, whereby the semiconductor device 10 is obtained.

The semiconductor device and method of manufacturing a semiconductor device of the embodiments described above may incorporate appropriate modifications that are still within the gist of the invention. The constituent features of any of the embodiments may also be applied as appropriate to the other embodiments.

For example, two or three trench contact sections were disposed at the active terminal section in the embodiments of the semiconductor device described above, but the number of trench contact sections is not limited to this. Four or more trench contact sections may instead be disposed at the active terminal section.

Furthermore, in the embodiments of the semiconductor device described above, the semiconductor device had a silicon substrate or epitaxial layer, but the semiconductor device may instead have a silicon carbide substrate or epitaxial layer, or it may have a compound semiconductor substrate or epitaxial layer.

Moreover, in the embodiment of the semiconductor device manufacturing method described above, the trenches were formed by etching using the gate electrode and gate oxide film as masks, but the trenches may also be formed using separate masks from the gate electrode and gate oxide film.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having an active region and a voltage withstand region surrounding the active region, comprising:
    a first semiconductor layer of a first conductive type extending from the active region to the voltage withstand region;
    a second semiconductor region of a second conductive type, selectively disposed in the first semiconductor layer at a front side thereof;
    a plurality of first trench contact sections disposed at a peripheral section of the active region in the second semiconductor region, the plurality of first trench contact sections being apart from one another, and extending in a first direction;
    a second trench contact section disposed at the peripheral section of the active region in the second semiconductor region, the second trench contact section extending in the first direction, and being further from the voltage withstand region than the plurality of first trench contact sections in a second direction orthogonal to the first direction;
    an electric conductor layer that electrically connects together the plurality of first trench contact sections; and
    a first conductive connection region of the second conductive type, disposed in the second semiconductor region between the second trench contact section and the plurality of first trench contact sections, the first conductive connection region having a resistivity lower than a resistivity of the second semiconductor region, and electrically connecting the plurality of first trench contact sections to the second trench contact section.

2. The semiconductor device according to claim 1, wherein the first conductive connection region is disposed between the second trench contact section and the plurality of first trench contact sections, and between the second trench contact section and intervals between each adjacent two of the first trench contact sections.

3. The semiconductor device according to claim 1, further comprising
    a third trench contact section disposed in the second semiconductor region at the peripheral section of the active region, the third trench contact section being further from the voltage withstand region than the second trench contact section, the third trench contact section extending in the first direction, and being disposed apart from the second trench contact section, wherein
    the second trench contact section is formed by a plurality of conductor parts which extend in the first direction, and are apart from one another.

4. The semiconductor device according to claim 3, further comprising a second conductive connection region of the second conductive type, having a resistivity lower than the resistivity of the second semiconductor region, electrically connecting the second trench contact section and the third trench contact section, and being disposed in the second semiconductor region between the second trench contact section and the third trench contact section.

5. The semiconductor device according to claim 1, wherein a ratio of a total length of the plurality of first trench contact sections in the first direction, to a sum of the total length of the plurality of first trench contact sections and a total length of intervals between each adjacent two of the plurality of first trench contact sections in the first direction, is in a range of 50% to 99%.

6. The semiconductor device according to claim 1, further comprising a third semiconductor region of the second conductive type, disposed at bottoms of the second trench contact section and one of the plurality of first trench contact sections, the third semiconductor region having a resistivity lower than the resistivity of the second semiconductor region.

7. The semiconductor device according to claim 3, further comprising a fourth semiconductor region of the second conductive type having a resistivity lower than the resistivity of the second semiconductor region, at a bottom of the third trench contact section.

* * * * *